United States Patent
Chiang et al.

(10) Patent No.: US 10,879,393 B2
(45) Date of Patent: Dec. 29, 2020

(54) METHODS OF FABRICATING SEMICONDUCTOR DEVICES HAVING GATE STRUCTURE WITH BENT SIDEWALLS

(71) Applicant: Taiwan Semiconductor Manufacturing Co., Ltd., Hsinchu (TW)

(72) Inventors: Hsin-Che Chiang, Taipei (TW); Wei-Chih Kao, Taipei (TW); Chun-Sheng Liang, Puyan Township (TW); Jeng-Ya Yeh, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 91 days.

(21) Appl. No.: 16/152,877

(22) Filed: Oct. 5, 2018

(65) Prior Publication Data

US 2020/0058790 A1    Feb. 20, 2020

Related U.S. Application Data

(60) Provisional application No. 62/718,810, filed on Aug. 14, 2018.

(51) Int. Cl.
| | | |
|---|---|---|
| H01L 29/06 | (2006.01) | |
| H01L 29/78 | (2006.01) | |
| H01L 29/49 | (2006.01) | |
| H01L 21/28 | (2006.01) | |
| H01L 29/66 | (2006.01) | |
| H01L 21/3115 | (2006.01) | |

(52) U.S. Cl.
CPC .... *H01L 29/7845* (2013.01); *H01L 21/28088* (2013.01); *H01L 21/28123* (2013.01); *H01L 21/31155* (2013.01); *H01L 29/4966* (2013.01); *H01L 29/4983* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A method of fabricating a semiconductor device includes forming a dummy gate structure on a substrate, forming gate spacers on sidewalls of the dummy gate structure, and depositing an interlayer dielectric layer around the gate spacers. The method also includes removing the dummy gate structure to form a space between the gate spacers, and forming a gate structure in the space, wherein the gate structure includes a gate dielectric layer and a gate electrode layer over the gate dielectric layer. The method further includes removing a portion of the gate electrode layer to form a recess that is surrounded by the gate dielectric layer. In addition, the method includes implanting on the interlayer dielectric layer to form a strained layer for bending the gate dielectric layer and the gate spacers towards the recess.

20 Claims, 16 Drawing Sheets

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2015/0126023 A1* | 5/2015 | Choi | H01L 29/512 438/591 |
| 2017/0110576 A1* | 4/2017 | Kim | H01L 29/66545 |
| 2017/0117192 A1* | 4/2017 | Min | H01L 21/82385 |

* cited by examiner

ND BENT SIDEWALLS

METHODS OF FABRICATING SEMICONDUCTOR DEVICES HAVING GATE STRUCTURE WITH BENT SIDEWALLS

PRIORITY CLAIM AND CROSS-REFERENCE

This application claims the benefit of U.S. Provisional Application No. 62/718,810, filed on Aug. 14, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor integrated circuit (IC) industry has experienced exponential growth. Technological advances in IC materials and design have produced generations of ICs where each generation has smaller and more complex circuits than the previous generation. As the semiconductor IC industry has progressed into nanometer technology nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g, wrapping) utilizing the advantage of the increased surface area of the channel to produce faster, more reliable, and better-controlled semiconductor transistor devices. However, the decrease in scale has led to challenges that may not have been present in previous generations at larger sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
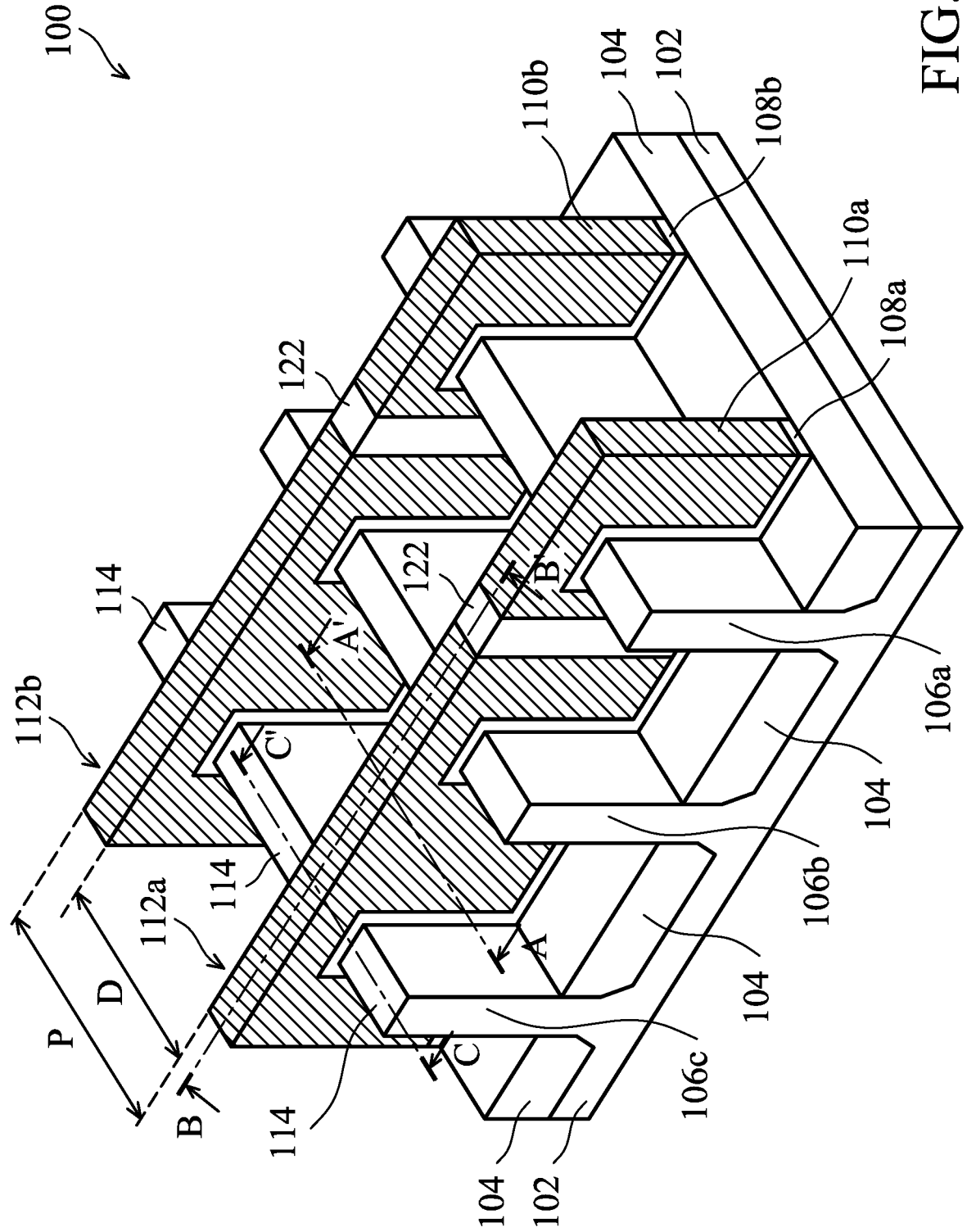
FIG. 1 shows a perspective view of a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments disclosed herein relate generally to fabricating semiconductor devices having a gate structure with bent sidewalls. In some embodiments, a gate electrode layer of the gate structure is recessed and a strained layer having a tensile stress is formed around the gate structure to apply a stress on a gate dielectric layer for bending the gate dielectric layer inwards and towards the gate electrode layer. As a result, the gate structure has bent sidewalls to shrink the top width thereof to increase the distance between the gate structure and a contact adjacent to the gate structure.

As the semiconductor industry has progressed into technology nodes of 10 nm, 7 nm, 5 nm, 3 nm and beyond, there is less of a pitch between the neighboring gate structures, and the space available for landing the contact adjacent to the gate structure has become smaller. Also, the distance between the gate structure and the adjacent contact has reduced in size, and there may be a bridge between a gate structure and an adjacent contact. According to embodiments of the disclosure, the gate structure is formed to have bent sidewalls which can increase the distance between the gate structure and the adjacent contact. Therefore, the embodiments of the disclosure can avoid a bridge between the gate structure and the adjacent contact while technology nodes in the semiconductor industry are being scaled down.

Moreover, according to embodiments of the disclosure, the gate structure is formed using a gate-last process (also referred to as a replacement gate process) without the sacrifice of a gate filling process window because the gate filling process is performed before bending the gate dielectric layer. Therefore, the embodiments of the disclosure can both satisfy the gate filling process window and increase the distance between the gate structure and the adjacent contact to avoid an electrical short-circuit.

The foregoing broadly outlines some aspects of embodiments described herein. Some embodiments described herein are described in the context of Fin Field Effect Transistors (FinFETs), and more particularly, in the context of a replacement gate process for FinFETs. Some embodiments described herein are described in the context of conductive features such as contacts in a metallization. Implementations of some aspects of the present disclosure may be used in other processes and/or in other devices. For example, other devices may include planar FETs, π-gate FETs, Ω-gate FETs, Gate-All-Around (GAA) FETs or another device. Some variations of the exemplary methods and structures are described. Throughout the various views and illustrative embodiments, like reference numbers are used to designate like elements. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

FIG. 1 illustrates a perspective (three-dimensional) view of a semiconductor device 100 such as an example of simplified FinFETs, in accordance with some embodiments. Other aspects not illustrated in or described with respect to FIG. 1 may become apparent from the following figures and description. The structure in FIG. 1 may be electrically connected or coupled in a manner to operate as, for example, one transistor or more, such as four transistors.

The semiconductor device 100 includes fins 106a, 106b and 106c protrudes from a semiconductor substrate 102. The semiconductor substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 102 may be made of silicon or another semiconductor material. For example, the semiconductor substrate 102 is a silicon wafer. In some examples, the semiconductor substrate 102 is made of a compound semiconductor such as silicon carbide, gallium arsenic, indium arsenide, or indium phosphide. In some examples, the semiconductor substrate 102 is made of an alloy semiconductor such as GaAsP, AlInAs, AlGaAs, GaInAs, GaInP, or GaInAsP.

Multiple isolation structures 104 are formed on the semiconductor substrate 102, and each of the fins 106a, 106b and 106c protrudes above the isolation structures 104 and is disposed between neighboring isolation structures 104. The isolation structure 104 is, for example a shallow-trench-isolation (STI) structure, which surrounds the bottom portions of the fins 106a, 106b and 106c. The isolation structure 104 is disposed between neighboring pairs of fins, for example the fins 106c and 106b.

In some embodiments, the fins 106a, 106b and 106c may be formed by patterning the semiconductor substrate 102 using photolithography and etching processes to form multiple trenches in the semiconductor substrate 102. Each of the trenches is between neighboring pairs of fins 106a-106c. The etching process may include a reactive ion etch (RIE), neutral beam etch (NBE), inductive coupled plasma (ICP) etch, or a combination thereof. Each of the trenches between neighboring pairs of fins 106a-106c is filled with an insulating material. The filled insulating material is then recessed to form the isolation structures 104, as shown in FIG. 1 in accordance with some embodiments. In some examples, the insulating material is for example silicon oxide, silicon nitride, silicon oxynitride, fluoride-doped silicate glass (FSG), or another low dielectric constant (low-k) dielectric material. The trenches may be filled with the insulating material using a deposition process, such as a chemical vapor deposition (CVD) process, a spin-on-glass (SOG) process, or another applicable process. The filled insulating material may be recessed using a dry etching process. The dry etching process may use etching gases including hydrogen fluoride (HF) gas, ammonia ($NH_3$) gas, and dilute gas (such as $N_2$ or Ar).

Multiple gate structures 112a and 112b are formed along sidewalls and over the top surface of the fins 106a-106c, and are also formed on the isolation structures 104, as shown in FIG. 1 in accordance with some embodiments. The longitudinal direction of the gate structures 112a-112b is perpendicular to the longitudinal direction of the fins 106a-106c. In some embodiments, each of the gate structures 112a and 112b is a dummy gate structure which will be replaced by a real gate structure using a gate-last process. The dummy gate structure 112a includes a dummy gate dielectric layer 108a and a dummy gate electrode layer 110a over the dummy gate dielectric layer 108a. The dummy gate structure 112b includes a dummy gate dielectric layer 108b and a dummy gate electrode layer 110b over the dummy gate dielectric layer 108b. In addition, source/drain regions 114 are disposed in respective regions of each the fins 106a-106c, at opposite sides of the gate structure 112a and at opposite sides of the gate structure 112b. Some source/drain regions 114 may be shared between two neighboring transistors, such as through coalescing the regions by epitaxial growth. For example, the neighboring FinFETs with the shared source/drain regions may be implemented as two functional transistors. Other configurations in other examples may implement other numbers of functional transistors.

The dummy gate dielectric layers 108a and 108b are along sidewalls and over top surfaces of the fins 106a-106c, and on the isolation structures 104. The dummy gate electrode layers 110a and 110b are over the dummy gate dielectric layers 108a and 108b, respectively. In some embodiments, the dummy gate electrode layers 110a and 110b may be made of poly-silicon. The dummy gate dielectric layers 108a and 108b may be made of silicon oxide, silicon nitride, silicon oxynitride or another dielectric material. The dummy gate dielectric layers 108a-108b and the dummy gate electrode layers 110a-110b are formed independently using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). Then, those deposited layers of the dummy gate dielectric layers 108a-108b and the dummy gate electrode layers 110a-110b are patterned into the dummy gate structures 112a and 112b using photolithography and etching processes. The etching process is anisotropic and may include a reactive ion etch (RIE), neutral beam etch (NBE), or another suitable etching process.

The dummy gate structures 112a and 112b will be replaced with replacement (real) gate structures. The replacement gate structure may include a high dielectric constant (high-k) gate dielectric layer and a metal gate electrode layer. Details of the materials and processes for forming the replacement gate structure will be described below and will refer to the cross-sectional views shown in FIGS. 4A-9A, FIGS. 4B-9B, FIGS. 12A-16A and FIGS. 12B-16B. In addition, FIG. 1 illustrates a reference cross-section along line A-A that is used in FIGS. 4A-9A and FIGS. 12A-16A. Line A-A is on a plane that is perpendicular to the gate structure 112a and on the isolation structure 104 between two neighboring fins 106c and 106b. FIG. 1 also illustrates a reference cross-section along line B-B that is used in FIGS. 4B-9B and FIGS. 12B-16B. Line B-B is on a plane along the gate structure 112a over two neighboring fins 106c and 106b until a gate isolation structure 122. The gate isolation structure 122 is formed between two portions of the gate structure 112a for electrically and physically isolating the two portions of the gate structure 112a from each other. Moreover, FIG. 1 illustrates a reference cross-section at line C-C that is used in FIGS. 2, 3, 10, 11 and 17 to 20. Line C-C is on a plane along a channel region in the fin 106c between opposing source/drain regions 114. In FIG. 1, for ease of depicting the figure, some components or features (for example, gate spacers, a contact etch stop layer, and an interlayer dielectric layer) illustrated in the following figures are omitted to avoid obscuring other components or features.

As the semiconductor industry has progressed into technology nodes of 10 nm, 7 nm, 5 nm, 3 nm and beyond, the pitch P (FIG. 1) between the neighboring gate-structures 112a-112b is scaled down. Also, the distance D between the neighboring gate structures 112a-112b is reduced. Meanwhile, the area for a contact (not shown) to the source/drain regions 114 needs to be large enough to provide electrical performance. The decrease in the distance between the gate structure and the adjacent contact may induce a bridge between the gate structure and the adjacent contact and cause an electric short circuit. According to embodiments of the disclosure, a gate structure is formed with bent sidewalls to shrink the top width thereof which can increase the distance between the gate structure and the adjacent contact to overcome the bridge between the gate structure and the adjacent contact issue. Moreover, gate filling process window for forming the replacement gate structure is not sacrificed in the embodiments of the disclosure.

Figure 2:
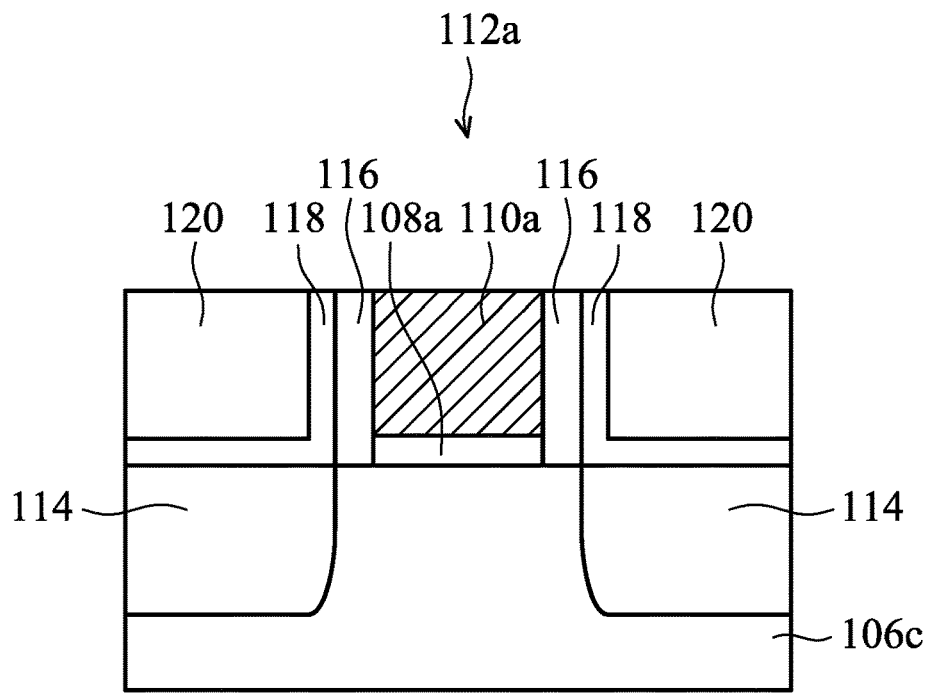
FIG. 2 shows a cross-sectional view of an intermediate structure for fabricating a semiconductor device taken along line C-C in FIG. 1, in accordance with some embodiments.

FIG. 2 illustrates a cross-sectional view of an intermediate structure at one stage of fabricating a semiconductor device taken along line C-C in FIG. 1, in accordance with some embodiments. In a gate-last process, a dummy gate structure 112a is formed over the fin 106c and gate spacers 116 are formed along the sidewalls of the dummy gate structure 112a, as shown in FIG. 2 in accordance with some embodiments. The dummy gate structure 112a includes a dummy gate electrode layer 110a and a dummy gate dielectric layer 108a formed under the dummy gate electrode layer 110a. In some examples, the dummy gate electrode layer 110a is made of poly-silicon, and the dummy gate dielectric layer 108a is made of a low-k dielectric material, for example silicon oxide.

Gate spacers 116 are formed along the sidewalls of the dummy gate structure 112a and over the fin 106c. The gate spacers 116 may be formed by conformally depositing one or more layers for the gate spacers 116 and anisotropically etching the one or more layers. The one or more layers for the gate spacers 116 may include silicon oxide ($SiO_2$), silicon nitride (SiN or $Si_3N_4$), silicon oxynitride (SiON), silicon carbon nitride (SiCN), or a combination thereof, and may be deposited by CVD, ALD, or another deposition process. The etching process may include a RIE, NBE, or another etching process.

Source/drain regions 114 are formed in the active regions of the fin 106c and at opposite sides of the dummy gate structure 112a. In some embodiments, the source/drain regions 114 are formed by implanting dopants into the active regions of the fin 106c using the dummy gate structure 112a and the gate spacers 116 as a mask. The source/drain regions 114 may be doped with suitable dopants such as p-type or n-type dopants which depend on the designed requirement of the FinFETs. Exemplary dopants may be, for example boron for a p-type FinFET, and phosphorus or arsenic for an n-type FinFET, although other dopants may be used.

Next, a contact etch stop layer (CESL) 118 is conformally deposited on the dummy gate structure 112a, on and along the sidewalls of the gate spacers 116, and on the active regions of the fin 106c such as the source/drain regions 114. The contact etch stop layer 118 is also deposited on the isolation regions 104 along line A-A in FIG. 1.

An interlayer dielectric (ILD) layer 120 is deposited on the contact etch stop layer 118. Generally, the contact etch stop layer 118 can provide a mechanism to stop an etching process when forming contacts on the source/drain regions 114. The contact etch stop layer 118 may be formed of a dielectric material having a different etch selectivity from the adjacent ILD layer 120. The material of the contact etch stop layer 118 may include silicon nitride, silicon carbon nitride or a combination thereof, and may be deposited by CVD, PECVD, ALD, or another deposition process. The material of the ILD layer 120 may include silicon dioxide or a low-k dielectric material (e.g., a material having a dielectric constant lower than silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 120 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 120 and the contact etch stop layer 118 to expose the dummy gate structure 112a and the gate spacers 116. After the planarization process, the top surfaces of the ILD layer 120 and the contact etch stop layer 118 are coplanar with the top surfaces of the dummy gate structure 112a and the gate spacers 116. After the dummy gate structure 112a is replaced with a real gate structure, contacts (not shown) are subsequently formed in the ILD layer 120 and pass through the contact etch stop layer 118 to be in contact with the source/drain regions 114.

Figure 3:
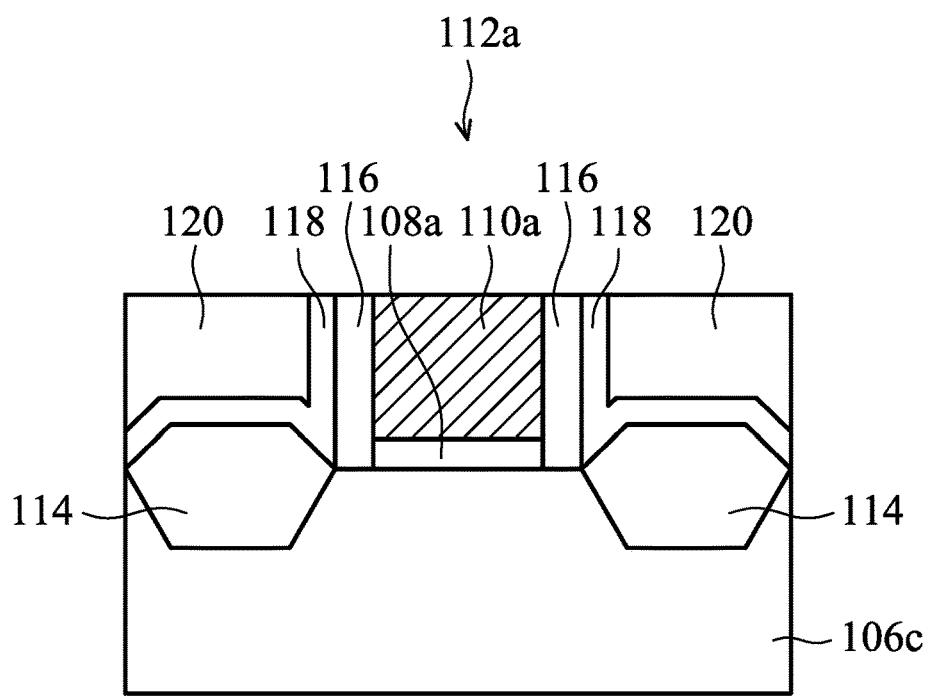
FIG. 3 shows a cross-sectional view of an intermediate structure for fabricating a semiconductor device taken along line C-C in FIG. 1, in accordance with some other embodiments.

FIG. 3 illustrates a cross-sectional view of an intermediate structure at one stage of fabricating a semiconductor device taken along line C-C in FIG. 1, in accordance with some other embodiments. One difference between the embodiments of FIG. 3 and FIG. 2 is that the source/drain regions 114 of FIG. 3 are epitaxial source/drain structures. The epitaxial source/drain structures may be formed by recessing the active areas of the fin 106c using the dummy gate structure 112a and the gate spacers 116 as a mask, and then the epitaxial source/drain structures are epitaxially grown in the recesses. The recessing the active areas of the fin 106c may be performed by an etching process. The etching process may be isotropic or anisotropic, or further may be selective with respect to one or more crystalline planes of the material of the fin 106c. Hence, the recesses can have various cross-sectional profiles based on the etching process implemented. The etching process may be a dry etching process, such as a RIE, NBE, or the like, or a wet etching process, such as using tetramethylammonium hydroxide (TMAH), ammonium hydroxide (NH$_4$OH), or another etchant.

The epitaxial source/drain structures may include silicon germanium (SixGe1-x, where x can be between approximately 0 and 1), silicon carbide, silicon phosphorus, germanium, a III-V compound semiconductor, a II-VI compound semiconductor, or the like. For example, the materials of a III-V compound semiconductor may include InAs, AlAs, GaAs, InP, GaN, InGaAs, InAlAs, GaSb, AlSb, AlP or GaP. The epitaxial source/drain structures may be formed by metal-organic CVD (MOCVD), molecular beam epitaxy (MBE), liquid phase epitaxy (LPE), vapor phase epitaxy (VPE), selective epitaxial growth (SEG), or a combination thereof. The epitaxial source/drain structures may be raised in relation to the top surface of the fin 106c, as illustrated in FIG. 3. The epitaxial source/drain structures may be doped by in-situ doping during the epitaxial growth and/or by implantation after the epitaxial growth. Hence, the source/drain regions 114 may be formed by epitaxial growth, and possibly with implantation, at opposite sides of the dummy gate structure 112a.

FIGS. 4A, 5A, 6A, 7A, 8A and 9A illustrate cross-sectional views of respective intermediate structures at various stages of an exemplary method for fabricating a semiconductor device taken along line A-A in FIG. 1, in accordance with some embodiments. The line A-A is on a plane that is perpendicular to the position of the dummy gate structure 112a and on the isolation structure 104 between two neighboring fins 106c and 106b. Meanwhile, FIGS. 4B, 5B, 6B, 7B, 8B and 9B illustrate cross-sectional views of respective intermediate structures at various stages of the exemplary method for fabricating the semiconductor device taken along line B-B in FIG. 1, in accordance with some embodiments. The cross-section along line B-B is on a plane along the position of the dummy gate structure 112a over two neighboring fins 106c and 106b and extending to a gate isolation structure 122.

Figure 4A:
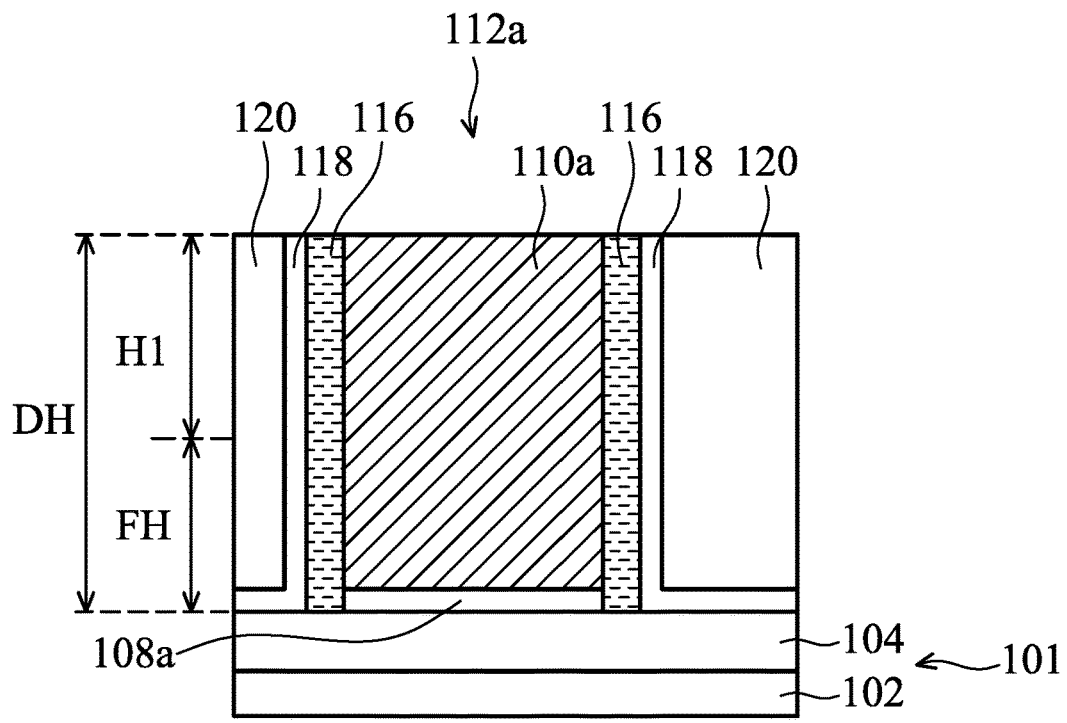
FIGS. 4A, 5A, 6A, 7A, 8A and 9A show cross-sectional views of respective intermediate structures at various stages of an exemplary method for fabricating a semiconductor device taken along line A-A in FIG. 1, in accordance with some embodiments.
Figure 4B:
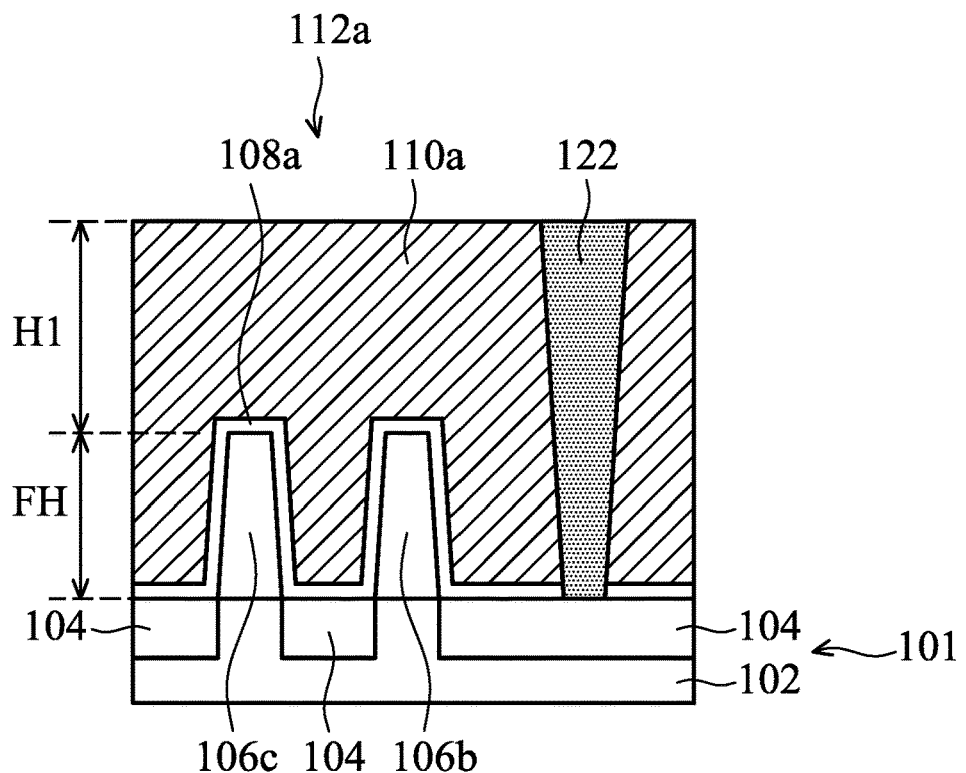
FIGS. 4B, 5B, 6B, 7B, 8B and 9B show cross-sectional views of respective intermediate structures at various stages of an exemplary method for fabricating a semiconductor device taken along line B-B in FIG. 1, in accordance with some embodiments.

The dummy gate structure 112a is formed over an isolation structure 104 and the semiconductor substrate 102 along line A-A of FIG. 1, as shown in FIG. 4A in accordance with some embodiments. In addition, the dummy gate structure 112a is formed over the isolation structures 104 and over the fins 106c and 106b along line B-B of FIG. 1, as shown in FIG. 4B in accordance with some embodiments. The isolation structures 104 and the semiconductor substrate 102 are referred to as a substrate 101 in the following figures. The dummy gate structure 112a has a total height DH that is the sum of a height H1 above the fin 106c or 106b and a fin height FH of the fin 106c or 106b. The dummy gate structure 112a includes a dummy gate electrode layer 110a and a dummy gate dielectric layer 108a formed under the dummy gate electrode layer 110a. The gate spacers 116 are along the sidewalls of the dummy gate structure 112a. The contact etch stop layer 118 and the ILD layer 120 are formed around the gate spacers 116 and the dummy gate structure 112a. The materials and processes of forming various features of FIG. 4A may be the same as or similar to those described above with respect to the corresponding features of FIGS. 1 and 2, and are not repeated herein.

The gate isolation structure 122 is formed in the dummy gate structure 112a and disposed between two portions of the dummy gate structure 112a, as shown in FIG. 4B in accordance with some embodiments. The gate isolation structure 122 can electrically and physically isolate the two portions of the dummy gate structure 112a from each other. In some embodiments, the gate isolation structure 122 is made of an electrical isolation material, such as silicon nitride (SiN or Si$_3$N$_4$), silicon oxide (SiO$_2$) or a combination thereof. The gate isolation structure 122 may be formed by forming an opening passing through the dummy gate structure 112a using photolithography and etching processes, and then filling the opening with the electrical isolation material using a deposition process. The deposited electrical isolation material over the dummy gate structure 112a and outside the opening may be removed in a CMP process to form the gate isolation structure 122.

Figure 5A:
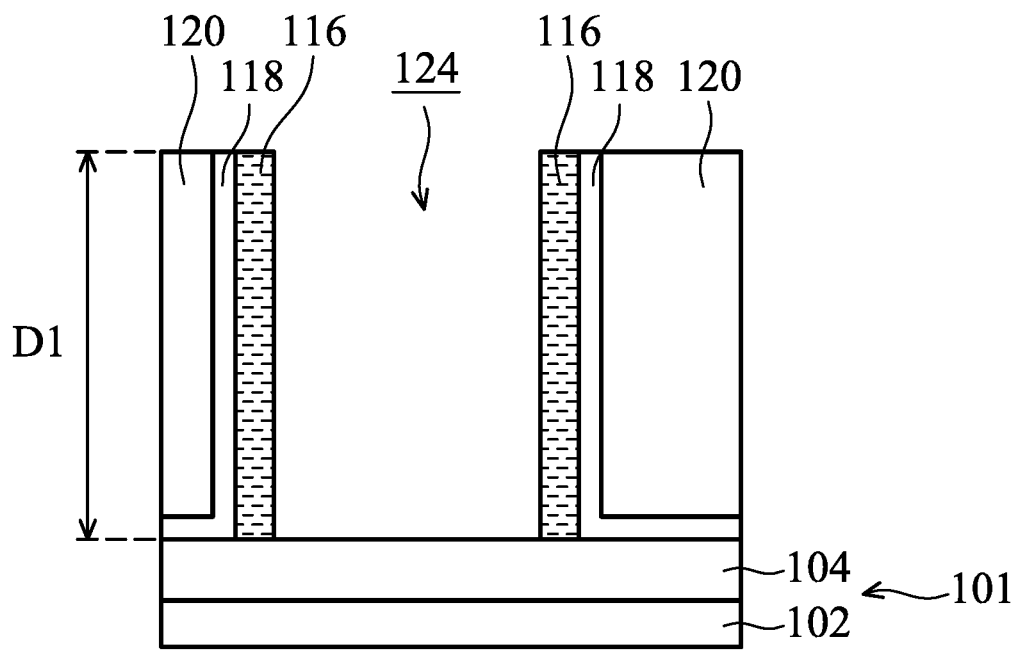
Figure 5B:
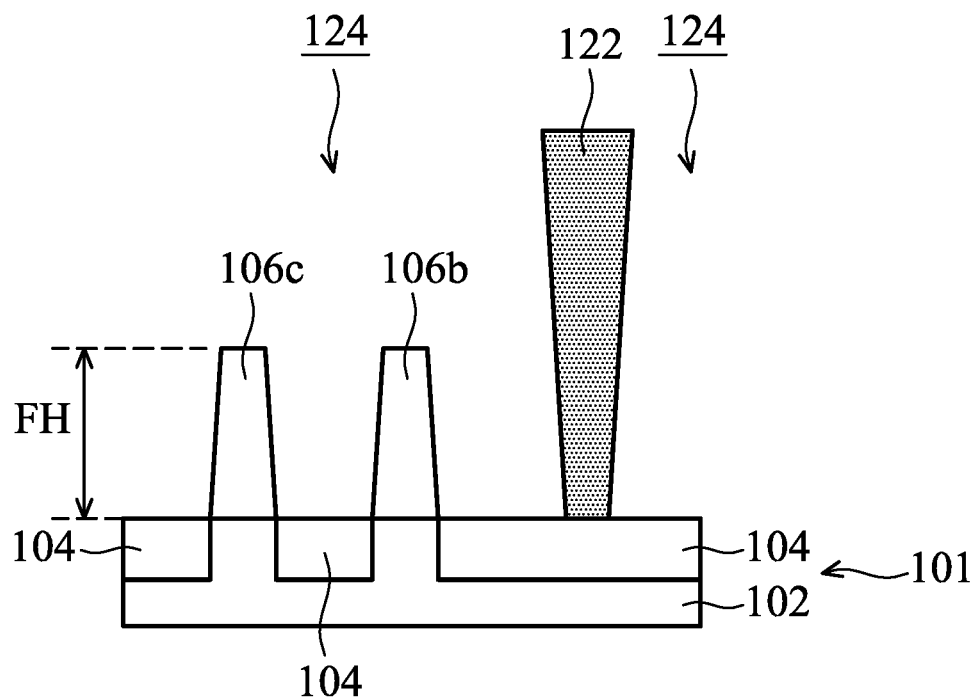

Next, the dummy gate structure 112a is removed in an etching process to form a space 124 between the gate spacers 116, as shown in FIG. 5A in accordance with some embodiments. Also, the space 124 is formed over the fins 106c and 106b on the substrate 101, and the gate isolation structure 122 remains on the substrate 101, as shown in FIG. 5B in accordance with some embodiments. The dummy gate electrode layer 110a and the dummy gate dielectric layer 108a may be removed in one or more etching processes to form the space 124. The etching processes may be a dry etching process such as a RIE or NBE process, a wet etching process, or another etching process. The space 124 may be a trench and has a depth D1 that is the same as the total height DH of the dummy gate structure 112a.

Figure 6A:
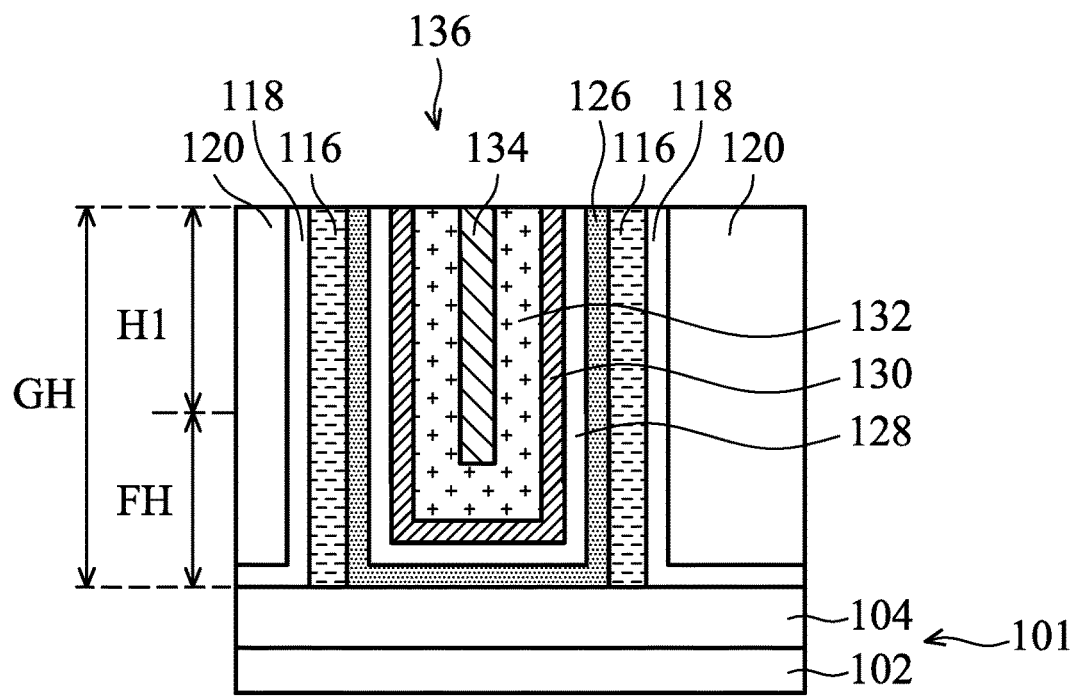
Figure 6B:
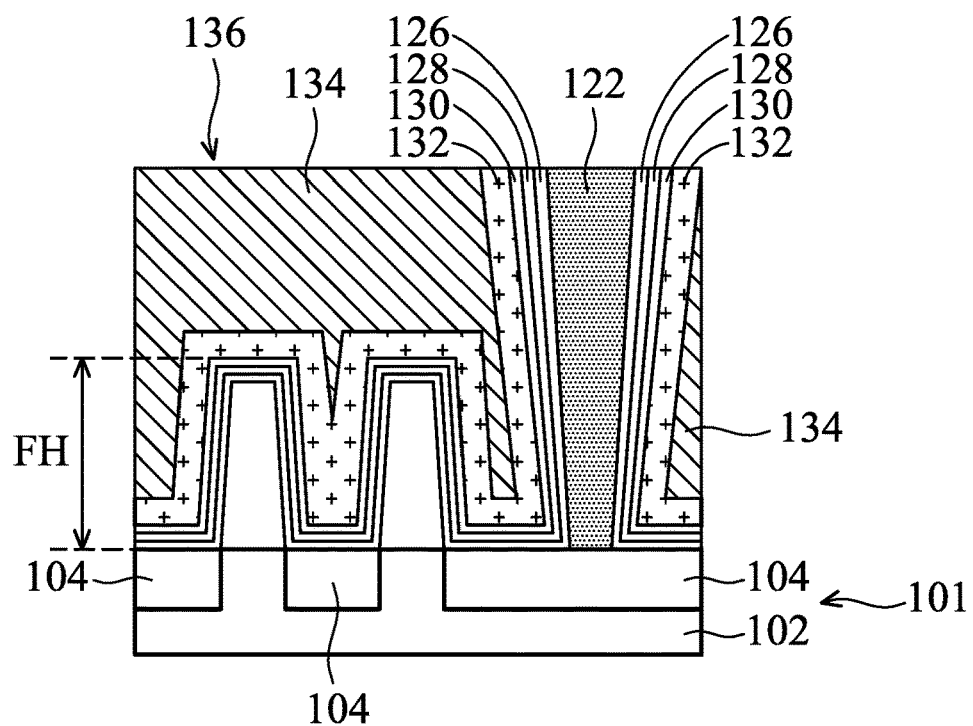

Afterwards, a replacement gate structure 136 is formed in the space 124 (FIGS. 5A and 5B), as shown in FIGS. 6A and 6B in accordance with some embodiments. The replacement gate structure 136 includes a gate dielectric layer 126 that is conformally deposited on the sidewalls and the bottom surface of the space 124, as shown in FIG. 6A in accordance with some embodiments. The gate dielectric layer 126 is also conformally deposited on the substrate 101, along the sidewalls and on the top surfaces of the fins 106c and 106b, and on the sidewalls of the gate isolation structure 122, as shown in FIG. 6B in accordance with some embodiments. The gate dielectric layer 126 may be made of a high-k dielectric material that may have a k value greater than about 7.0, for example. The high-k dielectric material may include a metal oxide of or a metal silicate of Hf, Al, Zr, La, Mg, Ba, Ti, Pb, or a combination thereof. The gate dielectric layer 126 may be deposited by ALD, PECVD, molecular-beam deposition (MBD), or another deposition process. In some examples, the gate dielectric layer 126 may have a thickness in a range from about 5 Å to about 30 Å, for example, from about 15 Å to about 25 Å.

The replacement gate structure 136 also includes a capping layer 128, a barrier layer 130 and a work-function tuning layer 132 which are conformally deposited over the gate dielectric layer 126 in sequence, as shown in FIGS. 6A and 6B in accordance with some embodiments. The capping layer 128 may include titanium nitride, titanium-silicon nitride, titanium-carbon nitride, titanium-aluminum nitride, tantalum nitride, tantalum-silicon nitride, tantalum-carbon nitride, aluminum nitride, or a combination thereof, and may be deposited by ALD, PECVD, MBD, or another deposition process. In some examples, the capping layer 128 may have a thickness in a range from about 5 Å to about 25 Å. The barrier layer 130 may include tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof, and may be deposited by ALD, PECVD, MBD, or another deposition process. In some examples, the barrier layer 130 may have a thickness in a range from about 5 Å to about 25 Å. The capping layer 128 may be referred to as another barrier layer.

The work-function tuning layer 132 may include titanium aluminum carbide (TiAlC), a titanium aluminum alloy (TiAl), tantalum-aluminum carbide, or a combination thereof, and may be deposited by ALD, PECVD, MBD, or another deposition process. In some examples, the work-function tuning layer 132 may have a thickness in a range from about 10 Å to about 60 Å. Other examples may have various other configurations of work-function tuning layers to achieve a desired performance of the FinFET to be formed. For example, any different number of work-function layers having various materials and/or thicknesses may be used. In some instances, for example, a p-type FinFET and an n-type FinFET may have different work-function tuning layers.

The replacement gate structure 136 further includes a metal fill material 134 to fill the remaining portion of the space 124, as shown in FIGS. 6A and 6B in accordance with some embodiments. The metal fill material 134 may include tungsten, cobalt, ruthenium, aluminum, copper, multi-layers thereof, or a combination thereof. The metal fill material 134 may be deposited by ALD, PECVD, MBD, PVD, or another deposition process. The capping layer 128, the barrier layer 130, the work-function tuning layer 132 and the metal fill material 134 may be referred to as a gate electrode layer of the replacement gate structure 136.

In addition, excess portions of the gate dielectric layer 126, the capping layer 128, the barrier layer 130, the work-function tuning layer 132 and the metal fill material 134 outside the space 124 and over the top surfaces of the ILD layer 120, the contact etch stop layer 118 and the gate spacers 116 may be removed in a planarization process, such as a CMP process. The result of the planarization process is illustrated as the structures of FIGS. 6A and 6B in accordance with some embodiments. The top surface of the replacement gate structure 136 is coplanar with the top surfaces of the ILD layer 120, the contact etch stop layer 118 and the gate spacers 116, as shown in FIG. 6A in accordance with some embodiments. Meanwhile, the top surface of the replacement gate structure 136 is coplanar with the top surface of the gate isolation structure 122, as shown in FIG. 6B in accordance with some embodiments.

In some other embodiments, the gate isolation structure 122 may be formed after the replacement gate structure 136 is completed. In the embodiments, an opening is formed that passes through the replacement gate structure 136. Thereafter, the gate isolation structure 122 is deposited to fill the opening in the replacement gate structure 136 for separating two portions of the replacement gate structure 136. In this embodiment, the gate dielectric layer 126, the capping layer 128, the barrier layer 130 and the work-function tuning layer 132 are not conformally deposited on the sidewalls of the gate isolation structure 122 (not shown in FIG. 6B).

The replacement gate structure 136 may have a total height GH that is the sum of a height H1 above the fin 106c or 106b and the fin height FH of the fin 106c or 106b. The total height GH of the replacement gate structure 136 may be equal to the total height DH of the dummy gate structure 112a. In addition, the total height GH of the replacement gate structure 136 may be equal to the depth D1 of the space 124 (FIG. 5A).

Figure 7A:
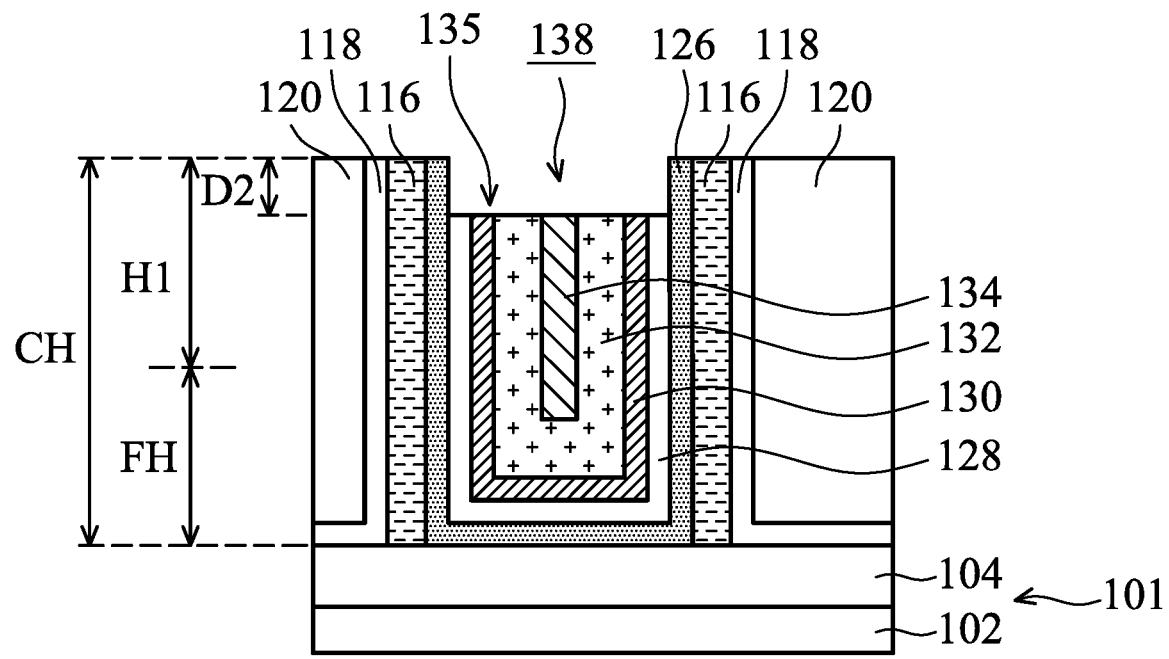
Figure 7B:
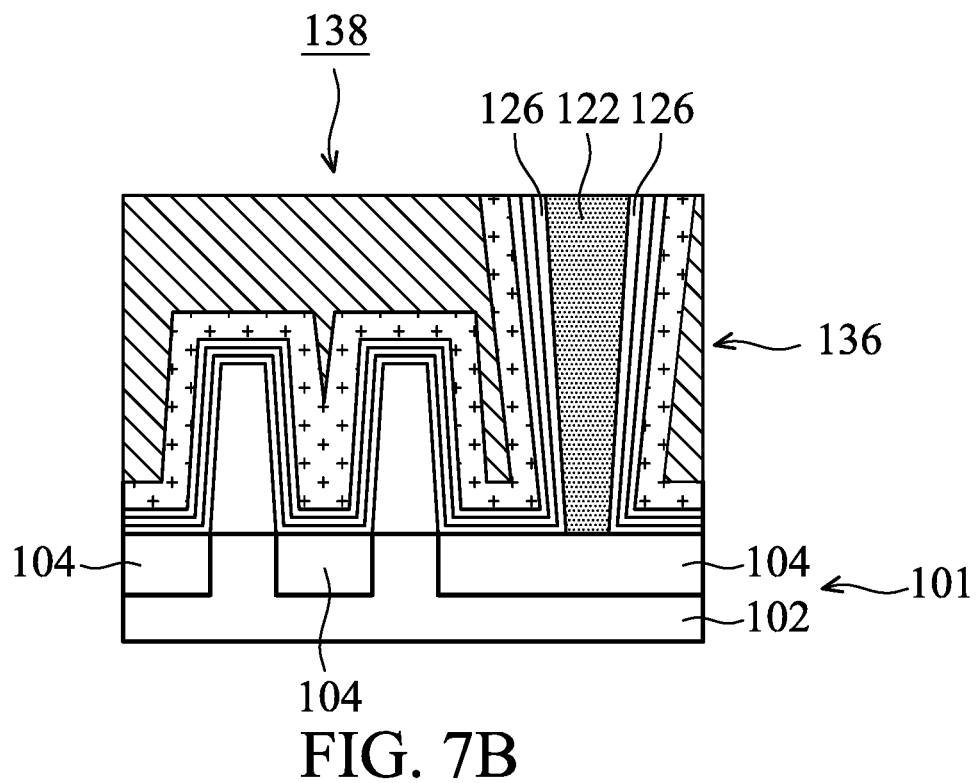

Next, an upper portion of the gate electrode layer of the replacement gate structure 136 is removed using an etching process to form a recess 138, as shown in FIGS. 7A and 7B in accordance with some embodiments. The etching process of forming the recess 138 substantially does not remove the gate dielectric layer 126, such that the gate dielectric layer 126 is higher than the remaining gate electrode layer 135, as shown in FIG. 7A in accordance with some embodiments. Moreover, the etching process of forming the recess 138 may also remove the upper portions of the gate isolation structure 122 and the gate dielectric layer 126 around the gate isolation structure 122, as shown in FIG. 7B in accordance with some embodiments. In the embodiments, the remaining portions of the replacement gate structure 136 and the gate isolation structure 122 have a coplanar top surface along line B-B of FIG. 1.

The etching process of forming the recess 138 may be a dry etching process or a wet etching process. In some embodiments, the dry etching process may include a reactive ion etch (RIE), neutral beam etch (NBE), inductive coupled plasma (ICP) etch, or a combination thereof. The dry etching process may be anisotropic and selective to remove the materials of the gate electrode layer of the replacement gate structure 136. The dry etching process may use etching gases including a chloride (Cl)-based etchant gas and dilute gas (such as $N_2$ or Ar). The Cl-based etchant gas includes $Cl_2$, $BCl_3$, HCl, or a combination thereof.

In some embodiments, the wet etching process of forming the recess 138 may use an etchant solution containing phosphoric acid additive. The etchant solution is for example a mixture of $H_2O_2$, $H_3PO_4$ and deionized water (DI water). The wet etching process may include an atomic layer etch back (ALE) cycle of using a mixture of $H_2O_2$, $H_3PO_4$ and $H_2O$, followed by using another mixture of $H_3PO_4$ and $H_2O$. The wet etching process of forming the recess 138 may be performed by repeating the ALE cycle 10 to 20 times. The wet etching process may be performed at a temperature in a range from about 25° C. to about 80° C.

In some other embodiments, the etching process of forming the recess 138 does not remove the gate isolation structure 122 and the gate dielectric layer 126 around the gate isolation structure 122. As a result, after the recess 138 is formed, the gate isolation structure 122 and the gate dielectric layer 126 around the gate isolation structure 122 are higher than the remaining gate electrode layer 135 (not shown in FIG. 7B).

In some examples, the recess 138 may have a depth D2 in a range from about 5 nm to about 10 nm. The fins 106a-106c may have a fin height FH in a range from about 5 nm to about 10 nm. The replacement gate structure 136 may have a height H1 above the fin in a range from about 15 nm to about 20 nm. The replacement gate structure 136 may have a gate height GH in a range from about 20 nm to about 30 nm before forming the recess 138. The gate height GH is substantially equal to the height of the gate dielectric layer 126. In some embodiments, the ratio of the depth D2 of the recess 138 to the gate height GH of the replacement gate structure 136 may be in a range from about 0.2 to about 0.5. Also, the ratio of the depth D2 of the recess 138 to the depth D1 of the space 124 may be in a range from about 0.2 to about 0.5. The ratio greater than 0.5 will loss excessive gate height of the replacement gate structure 136. The ratio lower than 0.2 will not be available for bending the sidewalls of the replacement gate structure 136.

Figure 8A:
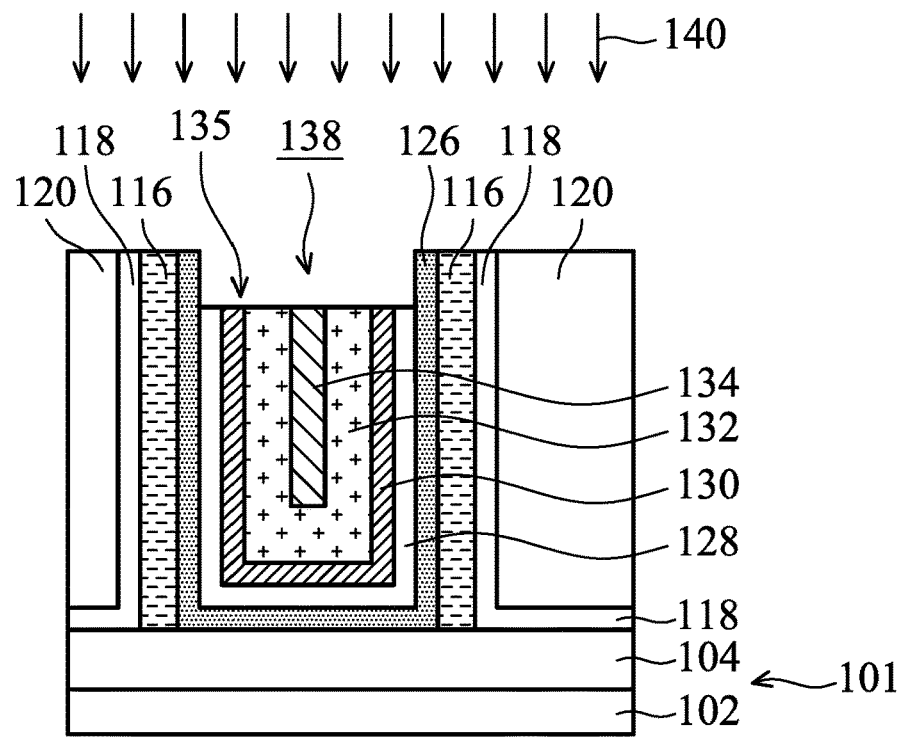
Figure 8B:
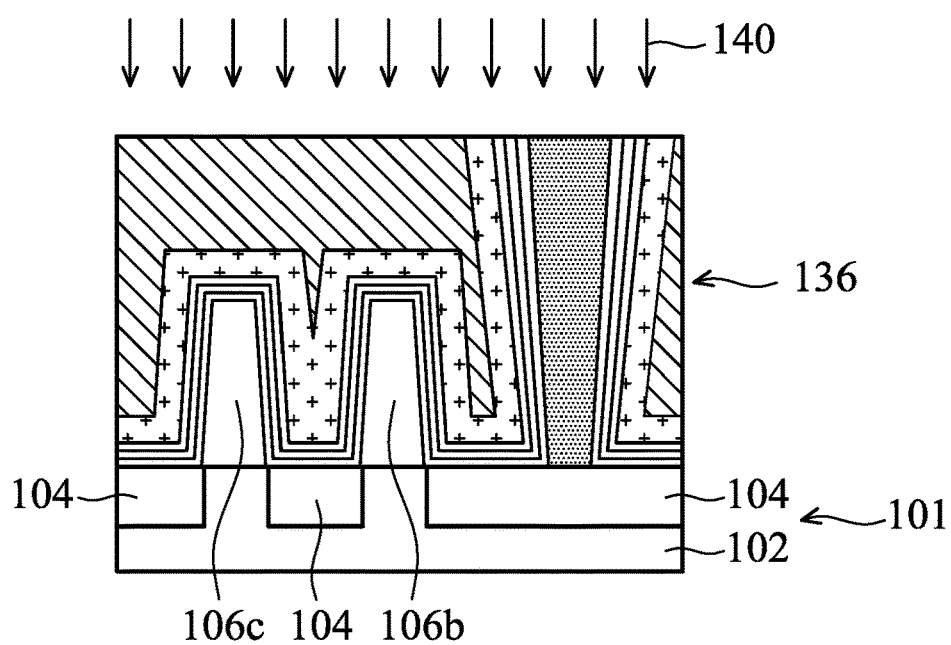

Next, an ion implantation process 140 is performed on the structures of FIGS. 7A and 7B, as shown in FIGS. 8A and 8B in accordance with some embodiments. The ion implantation process 140 may be blanketly performed on the ILD layer 120, the contact etch stop layer 118, the gate spacers 116 and the replacement gate structure 136, as shown in FIG. 8A in accordance with some embodiments. Also, the ion implantation process 140 may be blanketly performed on the gate isolation structure 122 and the replacement gate structure 136, as shown in FIG. 8B in accordance with some embodiments. The ion implantation process 140 on the structures of FIGS. 8A and 8B are performed simultaneously. The ion implantation process 140 may include a high-density plasma (HDP) implantation process. In some embodiments, the ion implantation process 140 may be performed using a dopant that includes Si, Ga, Sn, As, Ge, Sb, Ar, Pb, C or a combination thereof. The ion implantation process 140 may be performed with a doping energy in a range from about 1 keV to about 3 keV while the recess 138 has the depth D2 in a range from about 5 nm to about 10 nm. In addition, the ion implantation process 140 may be performed with a doping dose in a range from about 1E15 atoms/cm$^2$ to about 1E16 atoms/cm$^2$, for example from about 2E15 atoms/cm$^2$ to about 4E15 atoms/cm$^2$.

Figure 9A:
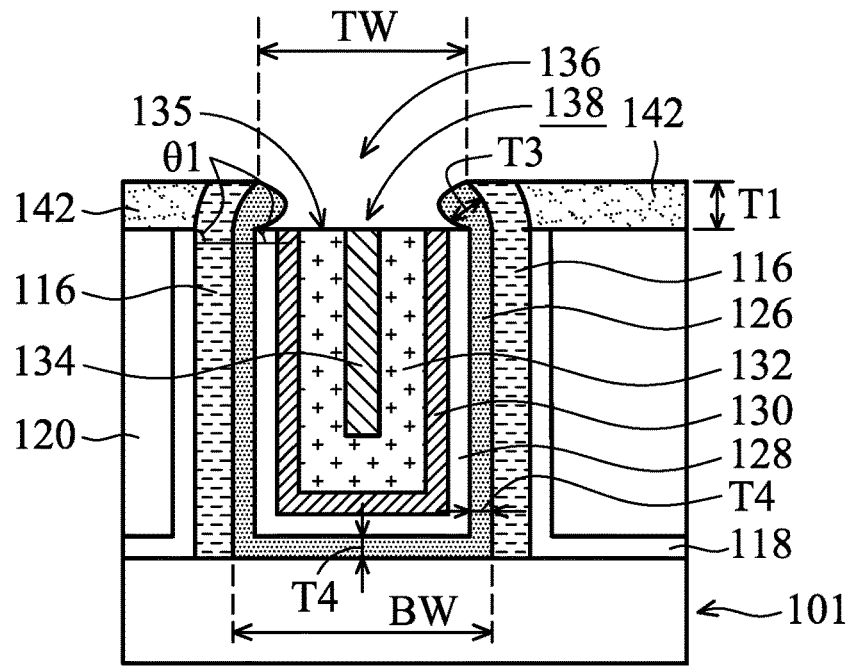
Figure 9B:
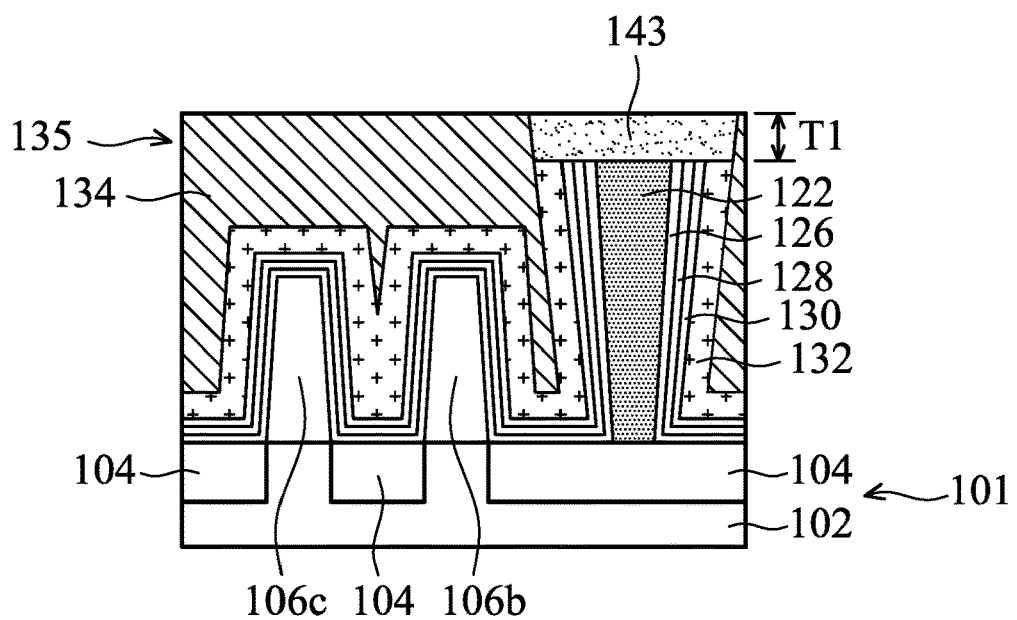

After the ion implantation process 140 is performed, a strained layer 142 is formed in the upper portions of the ILD layer 120 and the contact etch stop layer 118, as shown in FIG. 9A in accordance with some embodiments. At the same time, an ion implanted layer 143 is formed in the upper portions of the gate isolation structure 122, the gate dielectric layer 126 and various layers of the gate electrode layer 135 except for the metal fill material 134, as shown in FIG. 9B in accordance with some embodiments. The strained layer 142 and the ion implanted layer 143 may have the same thickness T1 that is substantially equal to the depth D2 of the recess 138. For example, in the embodiments, the thickness T1 may be in a range from about 5 nm to about 10 nm. In some embodiments, the ratio of the thickness T1 of the strained layer 142 to the gate height GH of the replacement gate structure 136 may be in a range from about 0.2 to about 0.5. Also, the ratio of the thickness T1 of the strained layer 142 to the depth D1 of the space 124 may be in a range from about 0.2 to about 0.5.

The strained layer 142 has a tensile stress to bend the gate spacers 116 and the gate dielectric layer 126 inwards and towards the recess 138 and the gate electrode layer 135, as shown in FIG. 9A in accordance with some embodiments. The gate spacers 116 and the gate dielectric layer 126 can bend inwards and towards the gate electrode layer 135 due to the recess 138 providing a space and the strained layer 142 producing a tensile stress. In the embodiments, the gate spacers 116 and the gate dielectric layer 126 may have a bending angle θ1 in a range from about 80 degrees to about 85 degrees. Moreover, the bending positions of the gate spacers 116 and the gate dielectric layer 126 may be aligned with the strained layer 142.

According to embodiments of the disclosure, the replacement gate structure 136 has bent sidewalls due to the gate spacers 116 and the gate dielectric layer 126 bend inwards. Moreover, the replacement gate structure 136 with the bent sidewalls has a top width TW that is smaller than the bottom width BW thereof. In some examples, the top width TW may be shrunk by a percentage of the bottom width BW that is in a range from about 5% to about 15% on each side of the replacement gate structure 136. For example, the bottom width BW may be about 20 nm, and the top width TW may shrink by about 1 nm to about 4 nm on each side; for example it may shrink by about 2 nm on each side. The shrinkage of the top width TW of the replacement gate structure 136 may vary based on the technology nodes of the semiconductor devices, such as 10 nm, 7 nm, 5 nm, 3 nm and beyond.

In addition, after the gate dielectric layer 126 is bent, the gate dielectric layer 126 has a top thickness T3 that is greater than the bottom thickness T4 thereof. The bent gate dielectric layer 126 has a thicker thickness at the top position near the recess 138 than the thickness thereof at the bottom position. In some examples, the bottom thickness T4 is in a range from about 15 Å to about 25 Å, and the top thickness T3 is greater than the bottom thickness T2 by about 3 Å to about 5 Å.

Figure 10:
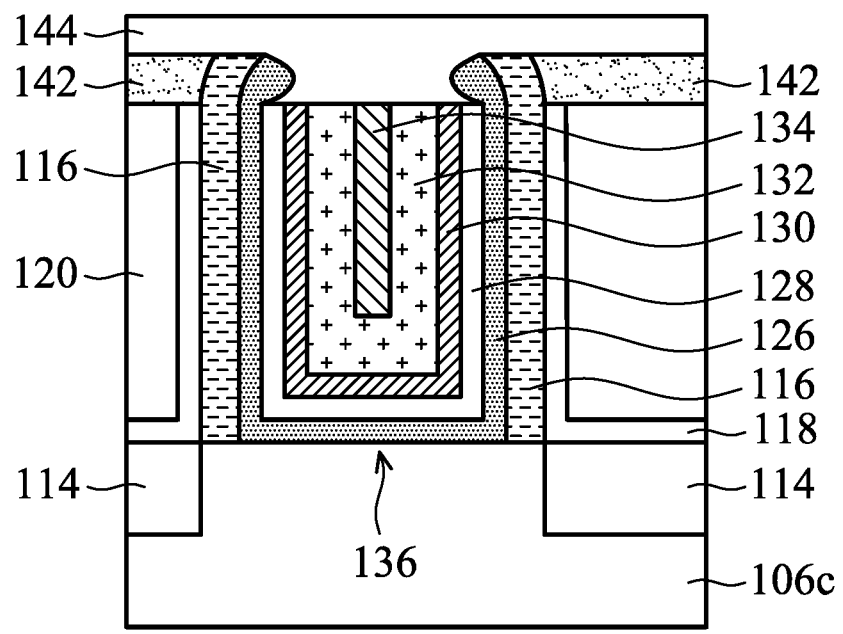
FIGS. 10 and 11 show cross-sectional views of respective intermediate structures at several stages of an exemplary method for fabricating a semiconductor device taken along line C-C in FIG. 1, in accordance with some embodiments.

Afterwards, an etch stop layer 144 is formed over the strained layer 142, the ILD layer 120, the contact etch stop layer 118, the gate spacers 116 and the replacement gate structure 136, as shown in FIG. 10 in accordance with some embodiments. FIG. 10 is taken along line C-C in FIG. 1, and line C-C is on a plane along a channel region in the fin 106c between opposing source/drain regions 114. Moreover, the recess 138 (FIG. 9A) is also filled with the etch stop layer 144. In some embodiments, the material and the process of forming the etch stop layer 144 may be the same as or similar to those of forming the contact etch stop layer 118.

Figure 11:
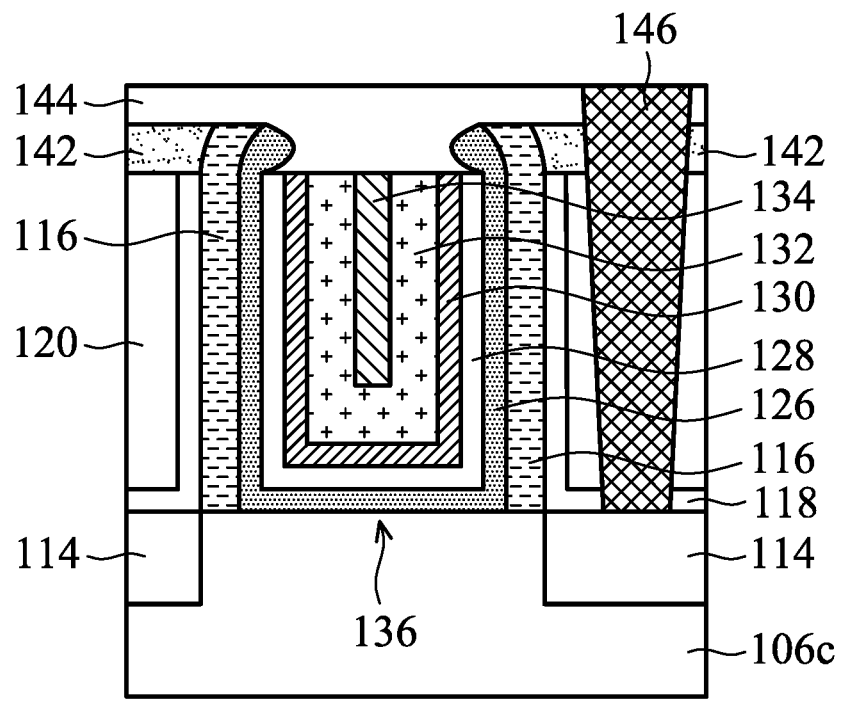

Next, a contact 146 is formed in the ILD layer 120, and the contact 146 passes through the etch stop layer 144, the strained layer 142, and the contact etch stop layer 118 to be in contact with the source/drain region 114, as shown in FIG. 11 in accordance with some embodiments. FIG. 11 is a cross-sectional view taken along line C-C in FIG. 1. The contact 146 is electrically connected to the source/drain region 114 and is adjacent to the replacement gate structure 136. The contact 146 may be formed by forming a contact hole in the ILD layer 120 and the contact hole passes through the etch stop layer 144, the strained layer 142, and the contact etch stop layer 118 using photolithography and etching processes. Then, the contact hole is filled with a conductive material. The conductive material includes a metal, such as cobalt, tungsten, copper, aluminum, gold, silver, alloys thereof, or a combination thereof. The conductive material may be deposited by CVD, ALD, PVD, or another deposition technique. A planarization process, such as a CMP process, may be performed to remove excess portions of the conductive material over the etch stop layer 144 to form the contact 146.

In some examples, a liner (not shown) is formed in the contact hole before the contact hole is filled with the conductive material. The liner is conformally deposited on the sidewalls and the bottom surfaces of the contact hole. The liner may be used as a diffusion barrier layer, an adhesion layer, or a combination thereof. The liner may include titanium, titanium nitride, tantalum, tantalum nitride, or the like. The liner may be deposited by ALD, PECVD, MBD, PVD, or another deposition technique. In addition, an anneal process may be performed to facilitate a reaction between some portions of the liner and the source/drain regions 114 to form silicide regions on the respective source/drain regions 114.

According to embodiments of the disclosure, the replacement gate structure 136 is formed with the bent sidewalls to shrink the top width TW thereof. As a result, the distance between the replacement gate structure 136 and the adjacent contact 146 can be increased. Therefore, the embodiments of the disclosure can effectively avoid a bridge between the gate structure and the adjacent contact as the technology nodes of the semiconductor devices develop towards, for example, 10 nm, 7 nm, 5 nm, 3 nm and beyond.

FIGS. 12A, 13A, 14A, 15A and 16A illustrate cross-sectional views of respective intermediate structures at various stages of another exemplary method for fabricating a semiconductor device taken along line A-A in FIG. 1, in accordance with some embodiments. Meanwhile, FIGS. 12B, 13B, 14B, 15B and 16B illustrate cross-sectional views of respective intermediate structures at various stages of the exemplary method for fabricating the semiconductor device taken along line B-B in FIG. 1, in accordance with some embodiments. In FIGS. 12A-16A and 12B-16B, the features which are the same as or similar to those features as described above with respect to FIGS. 4A-9A and 4B-9B may be designated with the same reference numerals. The materials and the processes for forming the various features of FIGS. 12A-16A and 12B-16B with the same reference numerals as those features in FIGS. 4A-9A and 4B-9B may be the same as or similar to those described above with respect to FIGS. 4A-9A and 4B-9B, and are not repeat herein.

Figure 12A:
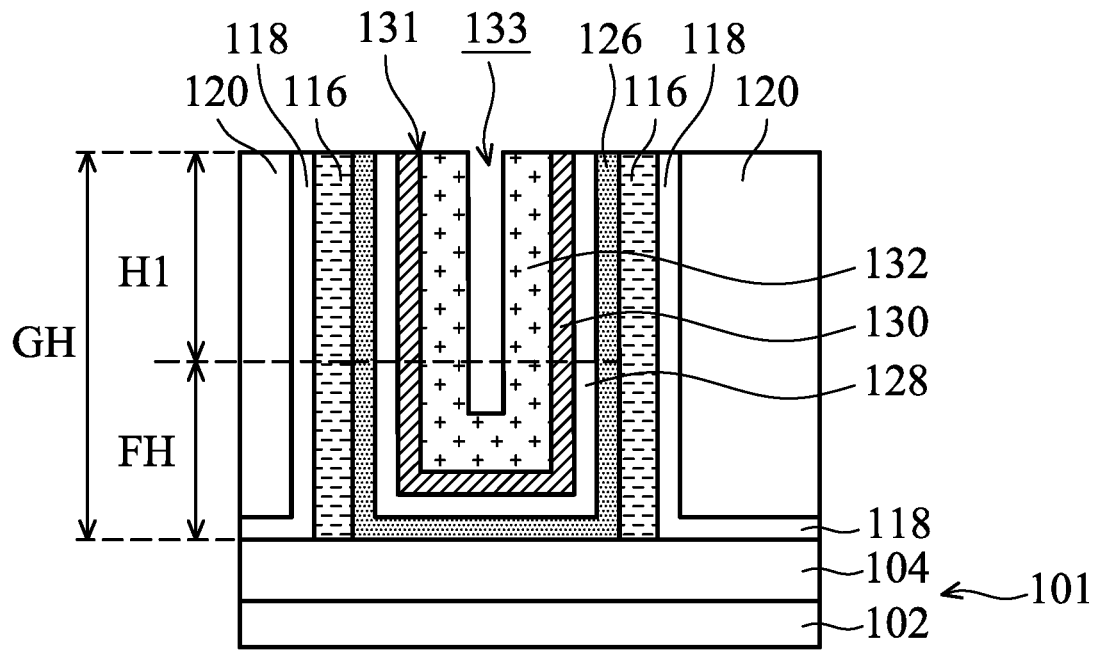
FIGS. 12A, 13A, 14A, 15A and 16A show cross-sectional views of respective intermediate structures at various stages of another exemplary method for fabricating a semiconductor device taken along line A-A in FIG. 1, in accordance with some embodiments.
Figure 12B:
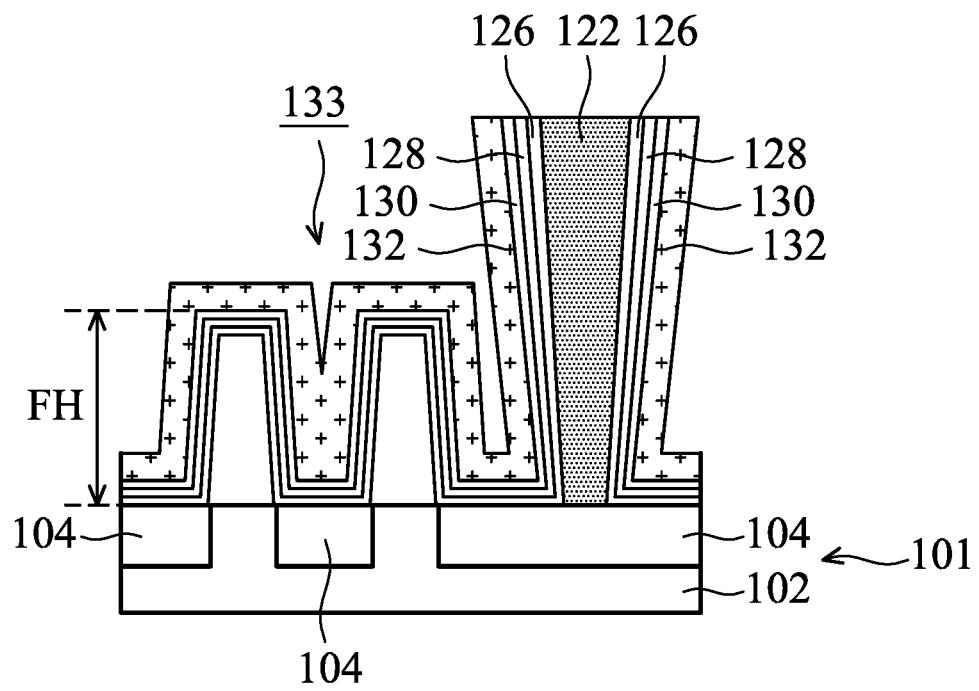
FIGS. 12B, 13B, 14B, 15B and 16B show cross-sectional views of respective intermediate structures at various stages of another exemplary method for fabricating a semiconductor device taken along line B-B in FIG. 1, in accordance with some embodiments.

Following the structures of FIGS. 5A and 5B, a gate dielectric layer 126 and a gate electrode layer 131 are formed in the space 124 (FIGS. 5A and 5B) between the gate spacers 116, as shown in FIGS. 12A and 12B in accordance with some embodiments. The gate electrode layer 131 includes the capping layer 128, the barrier layer 130 and the work-function tuning layer 132. In the embodiments, the gate electrode layer 131 does not include a metal fill material before recessing the gate electrode layer 131 and bending the gate dielectric layer 126. There is a gap 133 surrounded by the work-function tuning layer 132, as shown in FIG. 12A in accordance with some embodiments. Also, the gap 133 is over the work-function tuning layer 132, as shown in FIG. 12B in accordance with some embodiments.

Figure 13A:
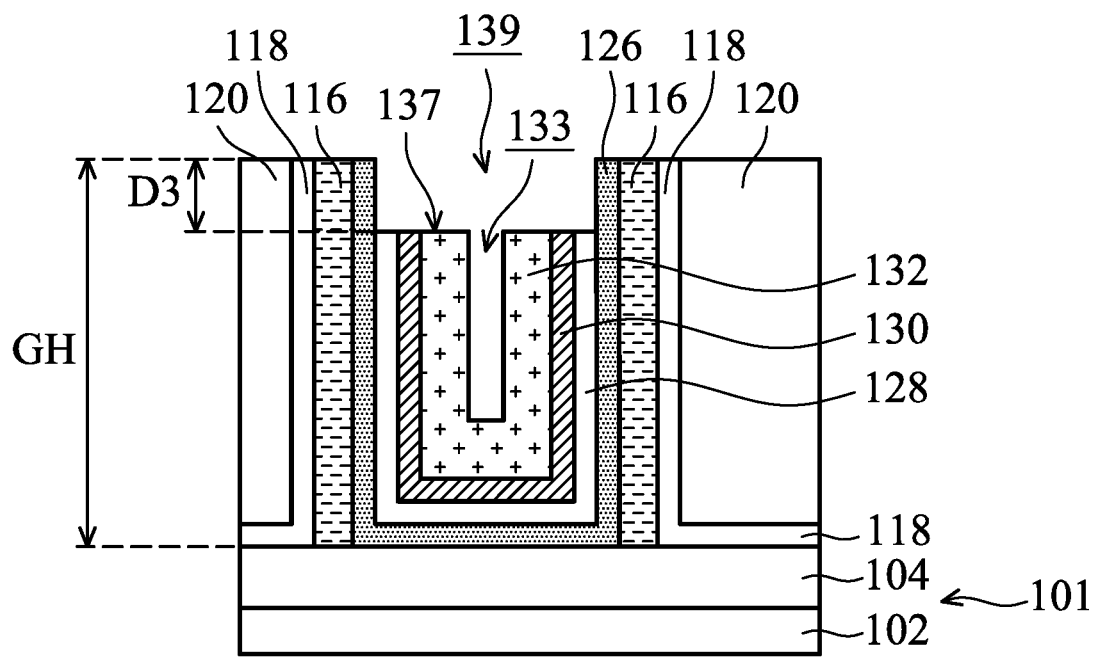
Figure 13B:
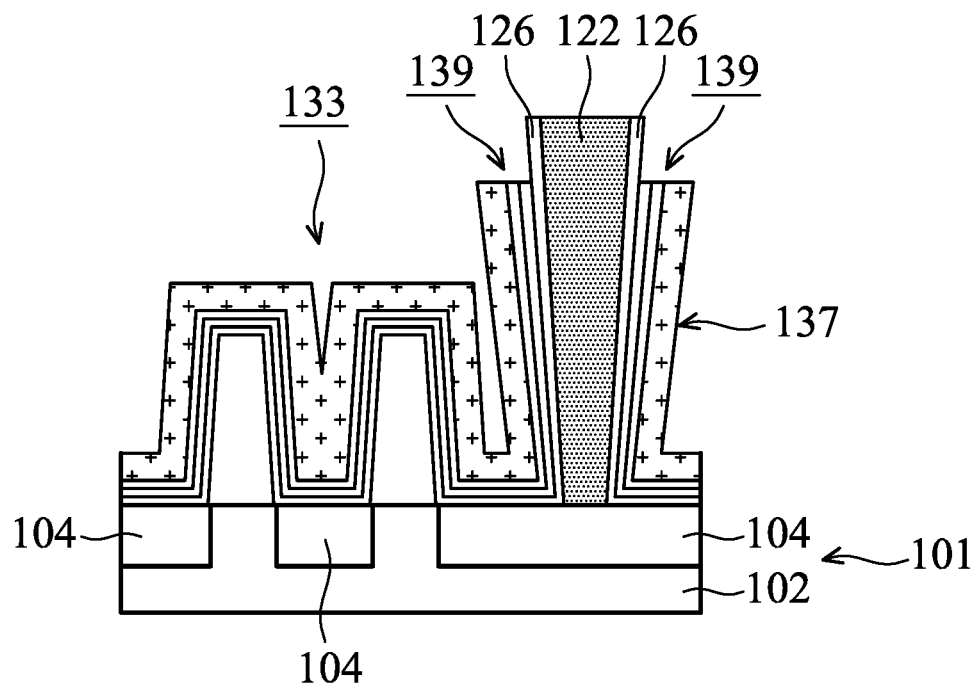

Next, the upper portion of the gate electrode layer 131 (FIG. 12A) is removed using an etching process to form a recess 139, as shown in FIGS. 13A and 13B in accordance with some embodiments. The etching process of forming the recess 139 does not remove the gate isolation structure 122 and the gate dielectric layer 126 around the gate isolation structure 122 in some embodiments. As a result, after the recess 139 is formed, the gate isolation structure 122 and the gate dielectric layer 126 around the gate isolation structure 122 are higher than the remaining gate electrode layer 137, as shown in FIG. 13B in accordance with some embodiments. In addition, the gate dielectric layer 126 is remained and is higher than the remaining gate electrode layer 137. In some embodiments, after the recess 139 is formed, the gate isolation structure 122 and the gate dielectric layer 126 around the gate isolation structure 122 may be removed in the etching process used to form the recess 139. The gate isolation structure 122 and the gate dielectric layer 126 around the gate isolation structure 122 may be coplanar with the remaining gate electrode layer 137 (not shown in FIG. 13B).

The etching process of forming the recess 139 may be a dry etching process or a wet etching process. In some embodiments, the dry etching process may include a reactive ion etch (RIE), neutral beam etch (NBE), inductive coupled plasma (ICP) etch, or a combination thereof. The dry etching process may be anisotropic and selective to remove the materials of the gate electrode layer of the replacement gate structure 136. The dry etching process may use a chloride (Cl)-based etchant gas and dilute gas (such as $N_2$ or Ar). The Cl-based etchant gas includes $Cl_2$, $BCl_3$, HCl or a combination thereof.

In some embodiments, the wet etching process of forming the recess 139 may use an etchant solution containing phosphoric acid additive. The etchant solution is for example a mixture of $H_2O_2$, $H_3PO_4$ and deionized water (DI water). The wet etching process may include an atomic layer etch back (ALE) cycle of using a mixture of $H_2O_2$, $H_3PO_4$ and $H_2O$, followed by using another mixture of $H_3PO_4$ and $H_2O$. The wet etching process of forming the recess 138 may be performed by repeating the ALE cycle 20 to 30 times. The wet etching process may be performed at a temperature in a range from about 25° C. to about 80° C.

In some examples, the recess 139 may have a depth D3 in a range from about 10 nm to about 15 nm. The fins 106a-106c may have a fin height FH in a range from about 5 nm to about 10 nm. The gate electrode layer 131 and the gate dielectric layer 126 may have a height H1 above the fin in a range from about 15 nm to about 20 nm. The gate electrode layer 131 and the gate dielectric layer 126 may have a gate height GH in a range from about 20 nm to about 30 nm before forming the recess 139. The gate height GH is substantially equal to the depth D1 of the space 124 (FIG. 5A). In some embodiments, the ratio of the depth D3 of the recess 139 to the gate height GH (or the depth D1 of the space 124) may be in a range from about 0.45 to about 0.70. In the embodiments, a metal fill material of the replacement gate structure will fill the gap 133 and the recess 139 after bending the gate dielectric layer 126. The ratio greater than 0.45 will be more available for bending the gate dielectric layer 126. The ratio lower than 0.70 will not loss excessive gate height of the gate electrode layer 131.

Figure 14A:
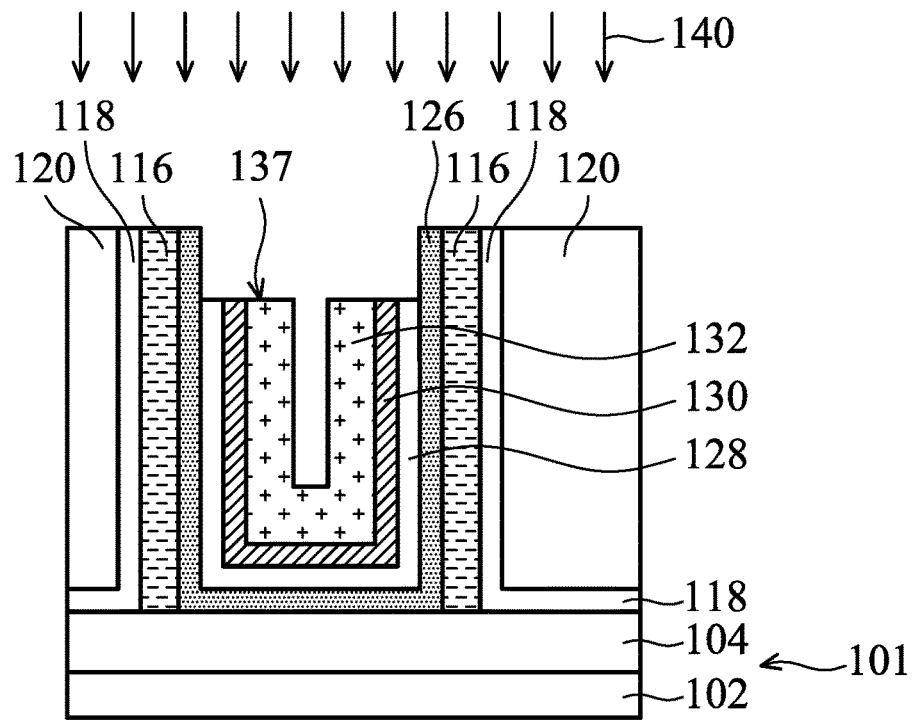
Figure 14B:
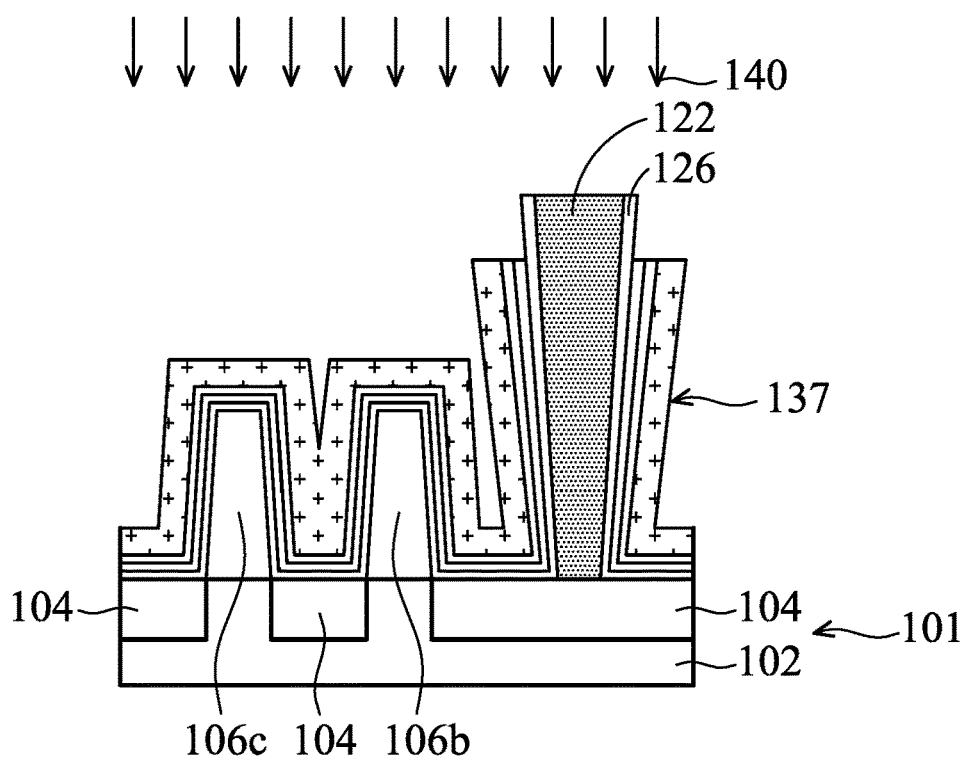

Next, an ion implantation process 140 is performed on the structures of FIGS. 13A and 13B, as shown in FIGS. 14A and 14B in accordance with some embodiments. The ion implantation process 140 may be blanketly performed on the ILD layer 120, the contact etch stop layer 118, the gate spacers 116, the gate dielectric layer 126 and the remaining gate electrode layer 137, as shown in FIG. 14A in accordance with some embodiments. Meanwhile, the ion implantation process 140 may be blanketly performed on the gate isolation structure 122, the gate dielectric layer 126 and the remaining gate electrode layer 137, as shown in FIG. 14B in accordance with some embodiments. The ion implantation process 140 on the structures of FIGS. 14A and 14B are performed simultaneously. In some embodiments, the ion implantation process 140 may use a dopant including Si, Ga, Sn, As, Ge, Sb, Ar, Pb, C or a combination thereof. The ion implantation process 140 may include a high-density plasma (HDP) implantation process. The ion implantation process 140 may be performed with a doping energy in a range from about 7 keV to about 8 keV while the recess 139 has the depth D3 in a range from about 10 nm to about 15 nm. In addition, the ion implantation process 140 may be performed with a doping dose in a range from about 1E15 atoms/cm$^2$ to about 1E16 atoms/cm$^2$, for example from about 2E15 atoms/cm$^2$ to about 4E15 atoms/cm$^2$.

Figure 15A:
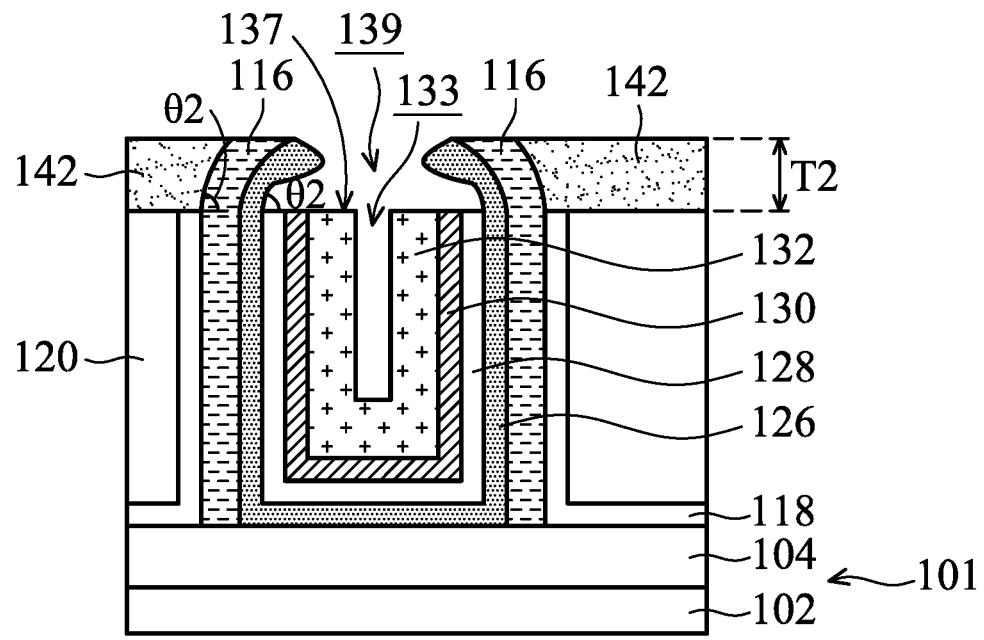
Figure 15B:
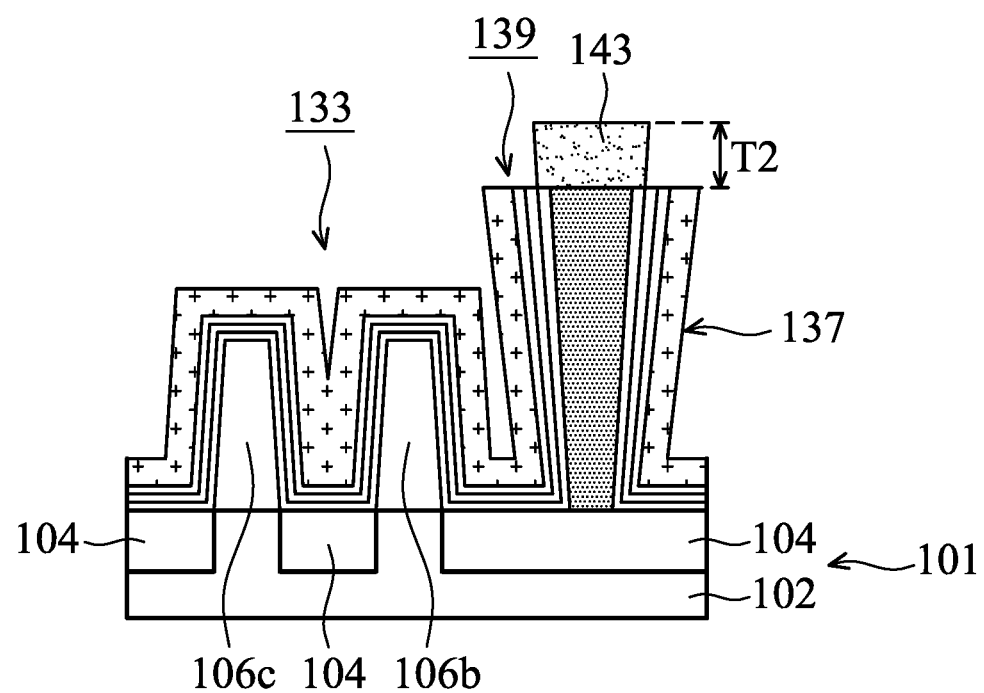

After the ion implantation process 140 is performed, a strained layer 142 is formed in the upper portions of the ILD layer 120 and the contact etch stop layer 118, as shown in FIG. 15A in accordance with some embodiments. At the same time, an ion implanted layer 143 is formed in the upper portions of the gate isolation structure 122 and the gate dielectric layer 126 around the gate isolation structure 122, as shown in FIG. 15B in accordance with some embodiments. The strained layer 142 and the ion implanted layer 143 may have a thickness T2 that is substantially equal to the depth D3 of the recess 139. For example, in some embodiments, the depth D3 of the recess 139 is in a range from about 10 nm to about 15 nm, and the thickness T2 may be in a range from about 10 nm to about 15 nm. In some other embodiments, the thickness T2 may be smaller than the depth D3 of the recess 139. For example, the thickness T2 may be in a range from about 8 nm to about 13 nm. In some embodiments, the ratio of the thickness T2 of the strained layer 142 to the gate height GH (or the depth D1 of the space 124) may be in a range from about 0.45 to about 0.70.

The strained layer 142 has a tensile stress to bend the gate spacers 116 and the gate dielectric layer 126 inwards and towards the recess 139 and the remaining gate electrode layer 137, as shown in FIG. 15A in accordance with some embodiments. The gate spacers 116 and the gate dielectric layer 126 can bend towards the remaining gate electrode layer 137 due to the recess 139 providing a space and the strained layer 142 producing a tensile stress to apply on the gate spacers 116 and the gate dielectric layer 126. In the embodiments, the gate spacers 116 and the gate dielectric layer 126 may have a bending angle θ2 in a range from about 75 degrees to about 80 degrees. Moreover, the bending positions of the gate spacers 116 and the gate dielectric layer 126 may be aligned with the strained layer 142.

Figure 16A:
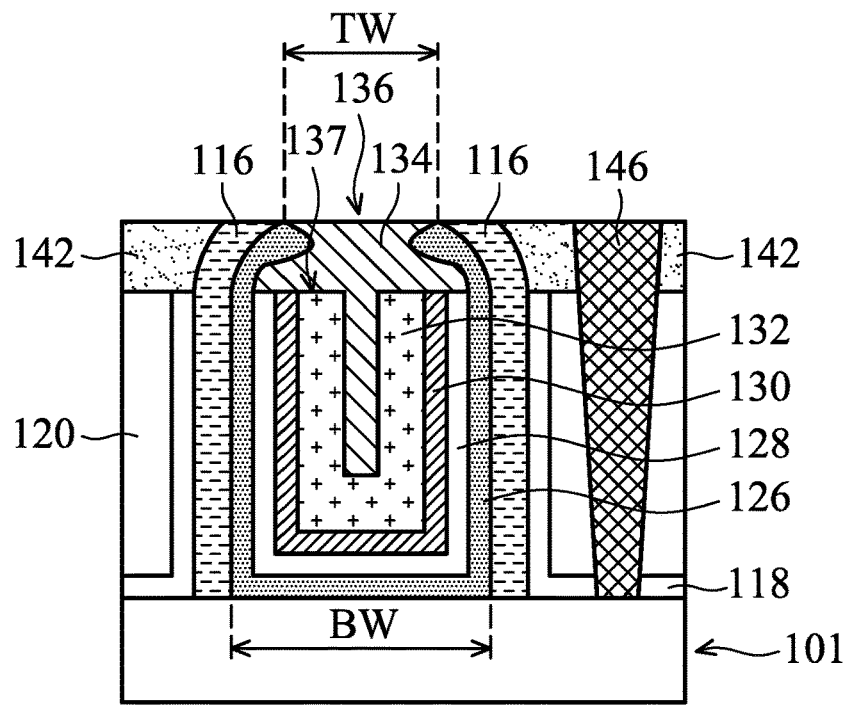
Figure 16B:
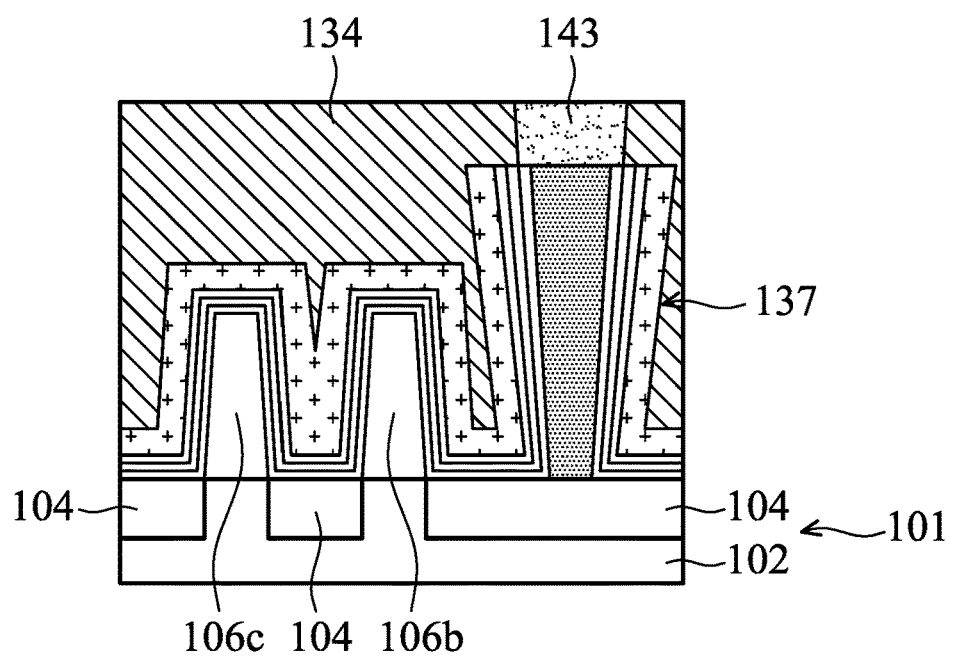

Afterwards, a metal fill material 134 is deposited to fill the recess 139 and the gap 133 (FIGS. 15A and 15B) to form a replacement gate structure 136, as shown in FIGS. 16A and 16B in accordance with some embodiments. The metal fill material 134 may be formed by depositing a metal layer over the ILD layer 120, the contact etch stop layer 118, the strained layer 142, the gate spacers 116, the gate dielectric layer 126 and the remaining gate electrode layer 137, in the recess 139 and the gap 133. Next, excess portions of the deposited metal layer over the strained layer 142 and the ion implanted layer 143 are removed in a planarization process, such as a CMP process. Thereafter, the metal fill material 134 has a top surface that is coplanar with the top surface of the strained layer 142, as shown in FIG. 16A in accordance with some embodiments. Also, the top surface of the metal fill material 134 is coplanar with the top surface of the ion implanted layer 143, as shown in FIG. 16B in accordance with some embodiments. The ion implanted layer 143 is formed in upper portions of the gate isolation structure 122 and the gate dielectric layer 126 around the gate isolation structure 122. The metal fill material 134 may include tungsten, cobalt, ruthenium, aluminum, copper, multi-layers thereof, or a combination thereof. The metal fill material 134 may be deposited by ALD, PECVD, MBD, PVD, or another deposition process.

In the embodiments, the replacement gate structure 136 has a top width TW that is smaller than the bottom width BW thereof. In some examples, the top width TW may shrink by a percentage of the bottom width BW that is in a range from about 10% to about 20% on each side of the replacement gate structure 136. For example, the bottom width BW is about 20 nm, and the top width TW can shrink by about 2 nm to 5 nm on each side. The shrinkage of the top width TW of the replacement gate structure 136 may vary based on the technology nodes of the semiconductor devices, for example 10 nm, 7 nm, 5 nm, 3 nm and beyond.

Figure 17:
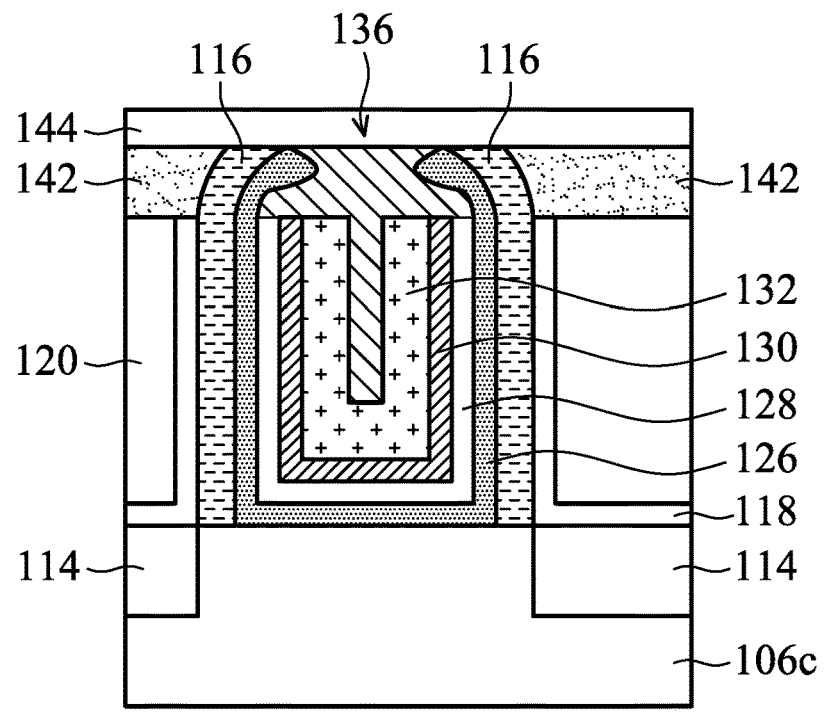
FIGS. 17 and 18 show cross-sectional views of respective intermediate structures at several stages of another exemplary method for fabricating a semiconductor device taken along line C-C in FIG. 1, in accordance with some embodiments.

Afterwards, an etch stop layer 144 is formed over the strained layer 142, the ILD layer 120, the contact etch stop layer 118, the gate spacers 116 and the replacement gate structure 136, as shown in FIG. 17 in accordance with some embodiments. FIG. 17 is a cross-sectional view taken along line C-C in FIG. 1, and line C-C is on a plane along a channel region in the fin 106c between opposing source/drain regions 114. In some embodiments, the materials and processes of forming the etch stop layer 144 may be the same as or similar to those of the contact etch stop layer 118.

Figure 18:
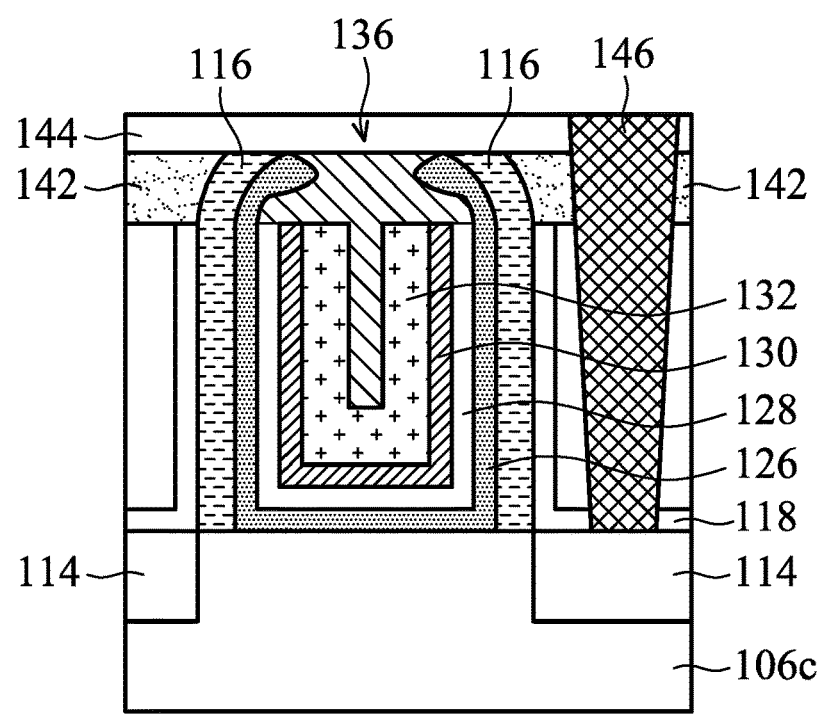

Next, a contact 146 is formed in the ILD layer 120 and passed through the etch stop layer 144, the strained layer 142, and the contact etch stop layer 118 to be in contact with the source/drain region 114, as shown in FIG. 18 in accordance with some embodiments. FIG. 18 is also a cross-sectional view taken along line C-C in FIG. 1. The contact 146 is electrically connected to the source/drain region 114. The contact 146 may be formed by forming a contact hole in the ILD layer 120 using photolithography and etching processes, and the contact hole may pass through the aforementioned layers, and then the contact hole is filled with a conductive material. The conductive material may include a metal, such as cobalt, tungsten, copper, aluminum, gold, silver, alloys thereof, or a combination thereof. The conductive material may be deposited by CVD, ALD, PVD, or another deposition technique. Then, excess portions of the conductive material deposited over the etch stop layer 144 are removed in a planarization process, such as a CMP process, to form the contact 146.

According to embodiments of the disclosure, the replacement gate structure 136 is formed with the bent sidewalls to shrink the top width TW. The shrinkage of the top width TW can increase the distance between the replacement gate structure 136 and the adjacent contact 146. Therefore, the embodiments of the disclosure can effectively avoid a bridge between the gate structure and the adjacent contact as the technology nodes of the semiconductor devices develop towards, for example, 10 nm, 7 nm, 5 nm, 3 nm and beyond. The reliability and production yield of the semiconductor devices are thereby improved.

Figure 19:
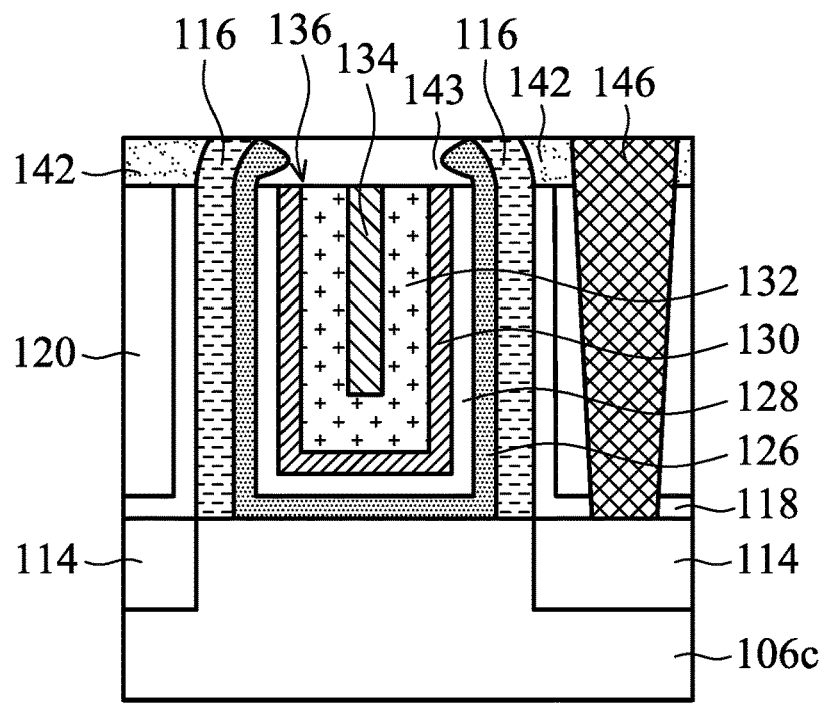
FIG. 19 shows a cross-sectional view of an intermediate structure at one stage of an exemplary method for fabricating a semiconductor device taken along line C-C in FIG. 1, in accordance with some embodiments.

FIG. 19 illustrates a cross-sectional view of an intermediate structure at one stage of another exemplary method for fabricating a semiconductor device taken along line C-C in FIG. 1, in accordance with some embodiments. Following the various stages for fabricating a semiconductor device as described above with respect to FIGS. 4A-9A, a hard mask 143 may be deposited on the replacement gate structure 136 to fill the recess 138. The material of the hard mask 143 may include silicon oxide ($SiO_2$), silicon nitride (SiN or $Si_3N_4$), a high-k dielectric material or a combination thereof. The high-k dielectric material is for example zirconium oxide ($ZrO_2$), aluminium oxide ($Al_2O_3$), hafnium oxide (HfOx) or another suitable metal oxide having a k value greater than 7.0. The material layer of the hard mask 143 may be deposited by ALD, PECVD, MBD, PVD, or another deposition process. Then, excess portions of the material layer of the hard mask 143 over the strained layer 142 are removed in a planarization process, such as a CMP process. Thereafter, the top surface of the hard mask 143 may be coplanar with that of the gate spacers 116 and the strained layer 142. In the embodiments, the hard mask 143 can be used in a self-aligned contact (SAC) process to form a contact 146 in the ILD layer 120, and the contact 146 may pass through the strained layer 142 and the contact etch stop layer 118. The contact 146 is adjacent to the replacement gate structure 136 and is electrically connected to the source/drain region 114. The materials and the processes for forming the contact 146 may be the same as or similar to those described above with respect to FIG. 11, and are not repeated herein.

In the embodiments of the disclosure, the hard mask 143 can isolate the replacement gate structure 136 from the contact 146 during the SAC process of forming the contact 146. Moreover, the replacement gate structure 136 with the bent sidewalls to shrink the top width thereof can increase the distance between the replacement gate structure 136 and the adjacent contact 146. The electrical isolation between the replacement gate structure 136 and the adjacent contact 146 is thereby improved. In addition, the replacement gate structure 136 with the bent sidewalls can further enlarge the SAC process window of forming the adjacent contact 146. Therefore, the contact 146 can be formed with a large landing area for a subsequent formed contact feature on the contact 146. The contact resistance between the contact 146 and the contact feature formed thereon is thereby reduced.

Figure 20:
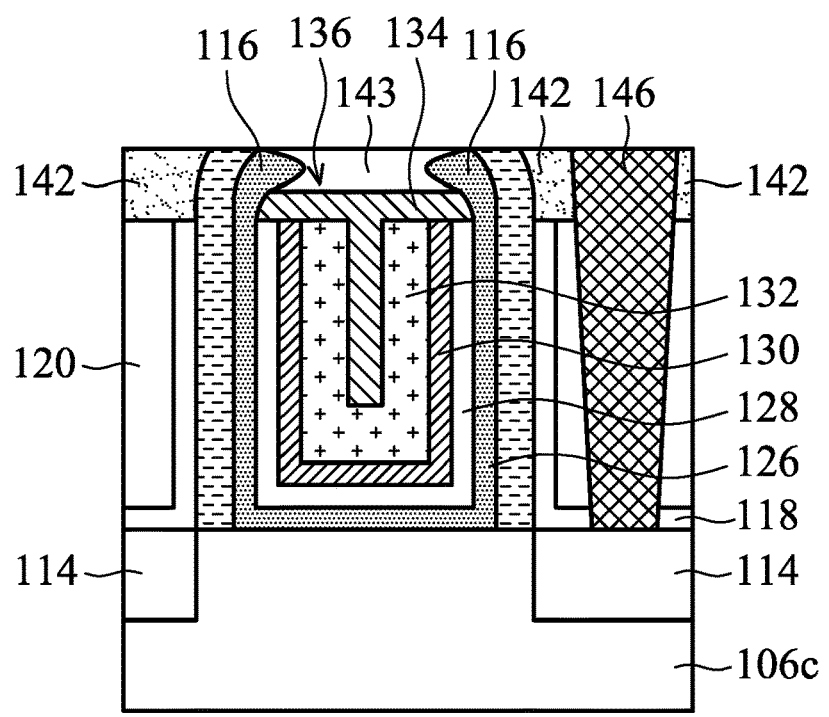
FIG. 20 shows a cross-sectional view of an intermediate structure at one stage of another exemplary method for fabricating a semiconductor device taken along line C-C in FIG. 1, in accordance with some embodiments.

FIG. 20 illustrates a cross-sectional view of an intermediate structure at one stage of another exemplary method for fabricating a semiconductor device taken along line C-C in FIG. 1, in accordance with some embodiments. Following the various stages for fabricating a semiconductor device as described above with respect to FIGS. 12A-16A, the metal fill material 134 of FIG. 16A is etched back to form a space surrounded by the bent gate dielectric layer 126. Next, a hard mask 143 is deposited on the etched-back metal fill material 134 of the replacement gate structure 136 to fill the space. The materials and the processes of forming the hard mask 143 may be the same as or similar to those described above with respect to FIG. 19, and are not repeated herein. In the embodiments, the hard mask 143 can be used in a self-aligned contact (SAC) process to form a contact 146 in the ILD layer 120, and the contact 146 may pass through the strained layer 142 and the contact etch stop layer 118. The contact 146 is adjacent to the replacement gate structure 136 and is electrically connected to the source/drain region 114. The materials and the processes for forming the contact 146 may be the same as or similar to those described above with respect to FIG. 18, and are not repeated herein.

In the embodiments of the disclosure, the hard mask 143 can isolate the replacement gate structure 136 from the adjacent contact 146 during the SAC process of forming the contact 146. Moreover, the replacement gate structure 136 with the bent sidewalls to shrink the top width thereof can increase the distance between the replacement gate structure 136 and the adjacent contact 146. According to the embodiments of the disclosure, the replacement gate structure 136 with the bent sidewalls can further enlarge the SAC process window of forming the contact 146. Therefore, the contact 146 can have a large landing area for forming a subsequently formed contact feature thereon. The contact resistance between the contact 146 and the contact feature thereon is thereby reduced. Moreover, the electrical isolation between the replacement gate structure 136 and the adjacent contact 146 is also improved.

According to the embodiments of the disclosure, the upper portion of the gate electrode layer of the replacement gate structure 136 is firstly removed to form a recess 138 or 139. The gate dielectric layer 126 of the replacement gate structure 136 is remained and is higher than the remaining gate electrode layer. Then, an ion implantation process 140 is performed to form a strained layer 142 in the upper portions of the ILD layer 120 and the contact etch stop layer 118. The strained layer 142 is located around the gate spacers 116. The strained layer 142 can produce a tensile stress to bend the gate spacers 116 and the gate dielectric layer 126 inwards. The gate spacers 116 and the gate dielectric layer 126 bend towards the gate electrode layer due to the strained layer 142 and the recess 138 or 139.

As a result, the top width of the replacement gate structure 136 can shrink to be smaller than the bottom width thereof and the replacement gate structure 136 has bent sidewalls. The shrinkage of the top width of the replacement gate structure 136 can increase the distance between the replacement gate structure 136 and the adjacent contact that is electrically connected to the source/drain region 114. Therefore, the embodiments of the disclosure can avoid a bridge between the gate structure and the adjacent contact and thereby prevent an electric short circuit. The electric isolation between the gate structure and the adjacent contact is improved and the reliability of the semiconductor devices is thereby enhanced.

Moreover, the shrinkage of the top width of the replacement gate structure 136 is produced after the space 124 between the gate spacers 116 is filled with the materials of the replacement gate structure 136. Therefore, in the embodiments of the disclosure, the gate filling process window is not affected or sacrificed.

As the semiconductor industry has progressed into nanometer technology nodes, the space available for disposing various features, such as a gate structure and an adjacent contact that is coupled to source/drain region in FinFET devices, has become smaller and smaller. According to the benefits mentioned above, the embodiments of the disclosure are suitable for semiconductor devices at technology node of 10 nm (N10), 7 nm (N7), 5 nm (N5), 3 nm (N3) and beyond.

In some embodiments, a method of fabricating a semiconductor device is provided. The method includes forming a dummy gate structure on a substrate, forming gate spacers on sidewalls of the dummy gate structure, and depositing an interlayer dielectric layer around the gate spacers. The method also includes removing the dummy gate structure to form a space between the gate spacers, and forming a gate structure in the space, wherein the gate structure includes a gate dielectric layer and a gate electrode layer over the gate dielectric layer. The method further includes removing a portion of the gate electrode layer to form a recess that is surrounded by the gate dielectric layer. In addition, the method includes implanting on the interlayer dielectric layer to form a strained layer for bending the gate dielectric layer and the gate spacers towards the recess.

In some embodiments, a method of fabricating a semiconductor device is provided. The method includes forming a dummy gate structure on a fin that protrudes from a semiconductor substrate, forming gate spacers on sidewalls of the dummy gate structure, and depositing an interlayer dielectric layer over the fin and surrounding the gate spacers. The method also includes forming a gate isolation structure in the dummy gate structure, and removing the dummy gate structure to form a space between the gate spacers. The method further includes forming a gate structure to fill the space, wherein the gate structure includes a gate dielectric layer and a gate electrode layer over the gate dielectric layer. In addition, the method includes removing a portion of the gate electrode layer to form a recess that is surrounded by the gate dielectric layer, and forming a strained layer in an upper portion of the interlayer dielectric layer using an ion implantation process for bending the gate dielectric layer and the gate spacers towards the recess.

In some embodiments, a semiconductor device is provided. The semiconductor device includes a fin protruding from a semiconductor substrate, and a gate structure over the fin, wherein the gate structure includes a gate dielectric layer and a gate electrode layer over the gate dielectric layer. The semiconductor device also includes a source region and a drain region in the fin and at opposite sides of the gate structure. The semiconductor device further includes gate spacers along sidewalls of the gate structure, and an interlayer dielectric layer around the gate spacers. In addition, the semiconductor device includes a strained layer formed in an upper portion of the interlayer dielectric layer, wherein the gate dielectric layer and the gate spacers bend towards the gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a dummy gate structure on a substrate;
   forming gate spacers on sidewalls of the dummy gate structure;
   depositing an interlayer dielectric layer around the gate spacers;
   removing the dummy gate structure to form a space between the gate spacers;
   forming a gate structure in the space, wherein the gate structure includes a gate dielectric layer and a gate electrode layer over the gate dielectric layer;
   removing a portion of the gate electrode layer to form a recess that is surrounded by the gate dielectric layer; and
   implanting a dopant on the interlayer dielectric layer to form a strained layer for bending the gate dielectric layer and the gate spacers towards the recess.

2. The method as claimed in claim 1, wherein the gate electrode layer comprises a barrier layer, a work-function tuning layer and a metal fill material, and upper portions of the barrier layer, the work-function tuning layer and the metal fill material are removed in an etching process to form the recess.

3. The method as claimed in claim 2, wherein a ratio of a depth the recess to the depth of the space is in a range from about 0.2 to about 0.5, a ratio of a thickness of the strained layer to the depth of the space is in a range from about 0.2 to about 0.5, and the gate dielectric layer and the gate spacers have a bending angle in a range from about 80 degrees to about 85 degrees.

4. The method as claimed in claim 2, further comprising:
   depositing an etch stop layer over the strained layer and to fill the recess after the gate dielectric layer and the gate spacers bend towards the recess; and
   forming a contact in the interlayer dielectric layer, wherein the contact passes through the etch stop layer and the strained layer, and the contact is adjacent to the gate structure.

5. The method as claimed in claim 1, further comprising:
   forming a hard mask in the recess after the gate dielectric layer and the gate spacers bend towards the recess; and
   forming a contact in the interlayer dielectric layer, wherein the contact passes through the strained layer, and the contact is adjacent to the gate structure.

6. The method as claimed in claim 1, wherein the gate electrode layer comprises a barrier layer and a work-function tuning layer, a gap is surrounded by the work-function tuning layer, and upper portions of the barrier layer and the work-function tuning layer are removed in an etching process to form the recess.

7. The method as claimed in claim 6, wherein a ratio of a depth of the recess to the depth of the space is in a range from about 0.45 to about 0.70, a ratio of the thickness of the strained layer to the depth of the space is in a range from about 0.45 to about 0.70, and the gate dielectric layer and the gate spacers have a bending angle in a range from about 75 degrees to about 80 degrees.

8. The method as claimed in claim 6, further comprising:
   depositing a metal fill material in the recess and in the gap after the gate dielectric layer and the gate spacers bend towards the recess; and
   planarizing the metal fill material to have a top surface that is coplanar with the strained layer.

9. The method as claimed in claim 8, further comprising:
   depositing an etch stop layer on the strained layer and on the top surface of the metal fill material; and
   forming a contact in the interlayer dielectric layer, wherein the contact passes through the etch stop layer and the strained layer, and the contact is adjacent to the gate structure.

10. The method as claimed in claim 8, further comprising:
    removing a portion of the metal fill material to form a space surrounded by the gate dielectric layer after the metal fill material is planarized;
    forming a hard mask in the space surrounded by the gate dielectric layer; and
    forming a contact in the interlayer dielectric layer, wherein the contact passes through the strained layer, and the contact is adjacent to the gate structure.

11. A method of fabricating a semiconductor device, comprising:
    forming a dummy gate structure on a fin that protrudes from a semiconductor substrate;
    forming gate spacers on sidewalls of the dummy gate structure;
    depositing an interlayer dielectric layer over the fin and surrounding the gate spacers;
    forming a gate isolation structure in the dummy gate structure;

removing the dummy gate structure to form a space between the gate spacers;

forming a gate structure to fill the space, wherein the gate structure includes a gate dielectric layer and a gate electrode layer over the gate dielectric layer;

removing a portion of the gate electrode layer to form a recess that is surrounded by the gate dielectric layer; and forming a strained layer in an upper portion of the interlayer dielectric layer using an ion implantation process for bending the gate dielectric layer and the gate spacers towards the recess.

12. The method as claimed in claim 11, wherein the ion implantation process is also performed on the gate isolation structure to form an ion implanted layer in an upper portion of the gate isolation structure.

13. The method as claimed in claim 11, wherein the ion implantation process includes a high-density plasma implantation process, and the ion implantation process is performed with a dopant including Si, Ga, Sn, As, Ge, Sb, Ar, Pb, C or a combination thereof.

14. The method as claimed in claim 11, wherein the gate isolation structure has a top surface that is higher than a top surface of the gate electrode layer after the recess is formed.

15. A method of fabricating a semiconductor device, comprising:

forming a gate structure between gate spacers, wherein the gate structure includes a gate dielectric layer and a gate electrode layer over the gate dielectric layer;

removing a portion of the gate electrode layer to form a recess that is surrounded by the gate dielectric layer;

depositing an interlayer dielectric layer around the gate spacers;

forming a strained layer in the interlayer dielectric layer for bending the gate dielectric layer and the gate spacers towards the recess; and forming an etch stop layer on the strained layer and the gate structure, wherein the etch stop layer fills the recess.

16. The method as claimed in claim 15, wherein the strained layer is formed in the interlayer dielectric layer using an ion implantation process.

17. The method as claimed in claim 15, wherein a gap is surrounded by the gate electrode layer, and a metal fill material is deposited in the recess and in the gap after the gate dielectric layer and the gate spacers bend towards the recess.

18. The method as claimed in claim 17, further comprising:

planarizing the metal fill material to have a top surface that is coplanar with the gate spacers; and forming an etch stop layer on the metal fill material and the gate spacers.

19. The method as claimed in claim 15, wherein after the bending, the gate dielectric layer has a top thickness and a bottom thickness, and the top thickness is greater than the bottom thickness.

20. The method as claimed in claim 15, wherein the gate electrode layer comprises a barrier layer and a work-function tuning layer, a gap is surrounded by the work-function tuning layer, and upper portions of the barrier layer and the work-function tuning layer are removed in an etching process to form the recess.

* * * * *